US005111278A

United States Patent [19]
Eichelberger

[11] Patent Number: 5,111,278
[45] Date of Patent: May 5, 1992

[54] THREE-DIMENSIONAL MULTICHIP MODULE SYSTEMS

[76] Inventor: Charles W. Eichelberger, 1256 Waverly Pl., Schenectady, N.Y. 12308

[21] Appl. No.: 676,936

[22] Filed: Mar. 27, 1991

[51] Int. Cl.$^5$ .................... H01L 23/16; H01L 23/02
[52] U.S. Cl. .......................... 357/75; 357/74; 357/71; 357/80; 357/65; 357/55; 357/72
[58] Field of Search ............... 357/75, 74, 65, 71, 357/55, 80, 72, 81

[56] References Cited

U.S. PATENT DOCUMENTS

| | | | |
|---|---|---|---|
| 4,714,516 | 12/1987 | Eichelberger et al. | 156/628 |
| 4,783,695 | 11/1988 | Eichelberger et al. | 357/65 |
| 4,835,704 | 5/1989 | Eichelberger et al. | 364/490 |
| 4,866,508 | 9/1989 | Eichelberger et al. | 357/74 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,901,136 | 2/1990 | Neugebauer et al. | 357/75 |
| 4,918,811 | 4/1990 | Eichelberger et al. | 29/840 |
| 4,933,042 | 6/1990 | Eichelberger et al. | 156/239 |

OTHER PUBLICATIONS

The STD-Process-New Developments and Applications, Clark et al., pp. 131–144, 1974, International Microwave Symposium.
Levinson et al., High Density Interconnects Using Laser Lithography, Proceed. of ISHM, Seattle, pp. 1–4, Oct. 1988.
Adams, Charlotte, Chasing the Elusive Gigaflop in a Soup Can, Military & Aerospace Electronics, pp. 26–29, 1991.

Primary Examiner—Georgia Epps
Attorney, Agent, or Firm—Heslin & Rothenberg

[57] ABSTRACT

Multichip integrated circuit packages and methods of fabrication, along with systems for stacking such packages, are disclosed. In one embodiment, the multichip package has an array of contact pads on an upper surface thereof and an array of contact pads on a lower surface thereof. Connection means are provided for electrically coupling at least some of the contact pads on each package surface with selected ones of the contact pads on the other surface, or selected interconnection metallization which is disposed between integrated circuits located within the package. The contact pads of each surface array are preferably equal in number and vertically aligned such that multiple multichip packages may be readily stacked, with a conductive means disposed therebetween for electrically coupling the contact pads of one package to the pads of another package. In addition, various internal and external heat sink structures are provided which facilitate dissipation of heat in a multichip package or in a stack of multichip packages. Specific processing methods for each of the various multichip modules and stack systems disclosed are described herein.

49 Claims, 13 Drawing Sheets

THREE-DIMENSIONAL MULTICHIP MODULE SYSTEMS

BACKGROUND OF THE INVENTION

1. Technical Field

The present invention is generally directed to improved multichip integrated circuit modules and, in particular, to such structures designed to facilitate three-dimensional stacking of modules.

2. Description of the Prior Art

Three-dimensional structures are especially important in the multichip module field because they provide a method for continuing an improved performance level derived from a single multichip module. In particular, the performance level of a conventional system suffers as soon as a signal is connected from the multichip module to the next level of interconnect, for example, to a printed circuit board. There are many forms that reduction in performance level can take. These include: the number of input/outputs required; electrical speed; power delivery; volume and weight considerations; and power dissipation.

A present state of the art multichip module system consists of one or more multichip modules connected together by a printed circuit board To understand the difference in performance level in such a system, one need only consider typical line and space capabilities on the multichip module in comparison with the printed circuit board. Typically, line widths are 10 mils and spaces are 10–15 mils on a printed circuit board. The much larger interconnects on the printed circuit board necessarily result in higher capacitance and fewer lines in a given area. Higher line capacitance in turn reduces the speed capability of the system. Also, as noted, a fewer number of interconnects per unit area can be provided, which produces a square law effect rather than linear. A typical reduction in interconnect density can be as high as 100 to 1 in going from a multichip module to a printed circuit board. A somewhat more subtle effect is the discontinuity associated with the connection from the printed circuit board to the multichip module, especially when using conventional lead type packages. This discontinuity limits the ultimate performance of the digital system to a level below one GHz, regardless of the care taken in laying out the printed circuit board and/or the multichip module.

As a result of lower interconnect density, the size of the system is dramatically increased. Further, although the multichip module gives a considerable decrease in system size over a system where each individual chip is connected on a circuit board, the use of a circuit board to interconnect individual multichip modules still results in a substantial increase in weight and volume of the overall system, i.e., compared to the weight and volume of the multichip module itself. It should be noted that in certain applications, such as space borne and portable electrical equipment applications, there is a very significant need for reduction in the total weight and volume of the system assembly. In aircraft avionics the same is true, especially given the need in retrofit markets to redo existing electronics in a much smaller package so that additional electronic capability can be added to existing aircraft. In addition, decreases in volume of an electronic system can result in the same system capability in a desk top computer as existed in a previous desk top unit coupled to a side rack standing on the floor.

One possible prior art approach to maintaining multichip module performance in electronic systems is to increase the area of the multichip module. This approach, however, has some very significant limits. As the size of the system is increased, the overall yield decreases. Ultimately the system can no longer be produced cost effectively. In addition, as the area of the system is increased its electrical performance suffers. This is due to the fact that interconnect lines have a finite resistance and this resistance quickly approaches the characteristic impedance of the interconnect as the size of the module increases beyond 2 inches by 2 inches. Another fundamental physical limitation in a very high performance system is the propagation time for signals. In a typical dielectric of relative permitivity of three, a signal propagates only four centimeters in 0.3 nanosecond. As a result, at clock rates above one GHz all electrical components must be within five centimeters, which is simply insufficient to allow a complex system to be constructed. Three-dimensional techniques can increase the number of components within a five centimeter range by factors of 50 to 100 in the ultimate limit.

The basic problem in a stack of multichip modules is to provide the required number of interconnects between modules within a given space. Typical prior art methods for interconnecting modules in a stack have used interconnects at the periphery of the module. By way of example, the HDI approach (which is described in co-filed patent application entitled, "Multichip Integratd Circuit Module and Method of Fabrication," Ser. No. 07/676,937, the entirety of which is hereby incorporated herein by reference) stacks modules with wrap around connections on the edge of the modules. Subsequently, an overlay layer is provided which interconnects between modules by making contact to the wrap around conductors. This approach has two disadvantages. The number of contacts is limited to the wiring pitch which can be accommodated around the periphery of the module. A 10 mil pitch is a practical upper limit and would result in a 2 by 2 module with 200 connections per side being available. While this number is sufficient for many applications, it does not compare to the wiring density available internal to the module itself. In addition, interconnects between modules are forced to go to the periphery of the module and, therefore, the interconnect distance between adjacent circuitry in two modules is, on average, twice as long as the distance between adjacent circuitry on the same module.

Another technique for interconnecting modules is the so called button contact. The button contact has the advantage that it can be provided with a relatively fine pitch in an area array format. It provides a short interconnect with a reasonably high degree of reliability and the interconnect is temporary in nature so that modules in the stack can be removed or replaced. In prior art systems where buttons have been used to interconnect stacks of circuit boards, rows of button contacts are used to interconnect between pads on the periphery of the circuit boards. Pursuant to the present invention, an ideal interconnect in terms of providing the maximum number of interconnects between modules is an area array interconnect where the entire top and bottom surface area of the module are covered with interconnect pads. If, for example, button contacts on 20 mil centers were used, the total number of interconnects available in a 2 inch by 2 inch module would be 10,000 interconnects. This number is compatible with the number of interconnects in a 2 inch by 2 inch multichip module. The major factor in prior art module stacks that prevents fabricating a module with area arrays covering the entire top and bottom surface is that there must be space provided for the electronic components themselves. Contacts passed from the bottom of a circuit board cannot reach the top of that circuit board because they would have to pass directly through an electronic component. In addition, while contacts could be provided on the printed circuit board side, there is no commensurate area for interconnect arrays above the components. There are no known systems in which arrays of interconnect pads are provided on both the top and bottom side of a module which could allow interconnect between modules by button contacts, solder bumps or the like.

Another problem associated with interconnect between modules occurs in high speed systems. In these systems, there is a need to provide an impedance match which matches the characteristic impedance of the lines which are interconnected. If a good match is not provided, the discontinuity will cause reflections which can result in erroneous data transmission. In addition, it is necessary to reduce cross coupling between adjacent lines both within the module and in the interconnect which connects adjacent modules.

In some systems, mechanical interconnects such as button contacts are not allowed because the reliability of mechanical contacts is substantially less than the reliability of pure metallurgical interconnect. In these systems, the problem is to provide a metallurgical interconnect which has high input/output capability and which provides very short interconnect distance between adjacent interconnected modules.

Removal of heat is a problem compounded by the increased number of components in a small space, which results when stacking multichip modules. If a heat sink is used between each module, the problem is to provide an interconnect between those modules which couples around the heat sink. In systems where weight and volume or lead length are major considerations, the problem is to provide maximum heat flow from one module to the next so that a number of modules can be stacked together before attaching them to a heat sink. Printed circuit board modules are virtually incapable of providing heat flow through the module. This is because the circuit board itself and the top of the packaged component both provide effective thermal barriers to heat flow. In the HDI stacked module with interconnect on the periphery, a reasonable amount of heat flow through the module could be provided. The major insulating barrier occurs in the interconnect, on top of the chips, and in the material used to attach the modules together. In view of the above, the need continues to exist in the art for an improved multichip integrated circuit package and heat sink structure designed to facilitate three-dimensional stacking of multichip modules.

SUMMARY OF THE INVENTION

In accordance with a preferred embodiment of the present invention, a multichip integrated circuit package having an upper surface and a lower surface comprises a substrate and a plurality of integrated circuit chip disposed on the substrate. The chips include interconnection pads for connecting to other integrated circuit components or for connecting to other pads of the same chip. An encapsulant surrounds the integrated circuit chips disposed on the substrate. The encapsulant has an upper surface, located above the tops of the integrated circuit chips, which has a plurality of via openings therein positioned so as to expose at least some of the interconnection pads on the chips. A pattern of electrical conductors is provided on the encapsulant such that the conductors extend between selected via openings so as to electrically connect selected interconnection pads. An array of conductor pads is disposed on the lower surface of the integrated circuit package and conductive means is provided within the substrate and the encapsulant. The conductive means is configured to provide electrical connection between at least some of the pads on the lower surface array of conductor pads and the interconnection conductors disposed on the upper surface of the encapsulant. Further, the conductive means is disposed within the encapsulant so as to pass between the plurality of integrated circuit chips.

In an enhanced embodiment, an array of conductor pads is also disposed on the upper surface of the package and the conductive means provides electrical connection between at least some of the lower surface array of conductor pads and at least one of the upper surface array of conductor pads and the interconnection conductors disposed on the upper surface of the encapsulant. In addition, the conductive means also provides electrical connection between at least some of the upper surface array of conductor pads and at least one of the lower surface array of conductor pads and the interconnection conductors disposed on the upper surface of the encapsulant. In a specific embodiment, the conductive means includes metalized via holes in the encapsulant extending to the upper surface of the substrate in the area of the encapsulant between the plurality of integrated circuit chips. Further, the conductive means includes metalized through holes disbursed throughout the substrate. Each through hole is configured to extend from the upper surface of the substrate to the lower surface of the substrate and each is electrically coupled to one of the conductor pads on the lower surface of the substrate. A second plurality of interconnection conductors is disposed on the upper surface of the substrate. This second plurality of conductors is positioned to electrically connect at least some of the metalized via openings positioned between the integrated circuit chips and the metalized through holes in the substrate. Numerous additional enhancements to these basic embodiments of the present invention are described and claimed herein.

In another aspect, the present invention comprises a multichip module stack system which includes a first multichip integrated circuit package and a second multichip integrated circuit package. Each of the packages has an array of contact pads on at least one of an upper surface and a lower surface thereof. Each of the array of contact pads is electrically connected to at least some of the integrated circuit chips which are disposed within the respective package. Each package includes a substrate and a plurality of integrated circuit chips disposed on the substrate. The chips include interconnection pads for connecting to other integrated circuit components or for connecting to other pads of the same chip. An encapsulant completely surrounds the integrated circuit chips disposed on the substrate. The encapsulant has an upper surface, located above the tops of the integrated circuit chips, which has a plurality of via openings therein so as to expose at least some of the interconnection pads on the chips. A pattern of electrical conductors is disposed on the encapsulant such that conductors extend between selected via openings so as to electrically connect selected interconnection pads. The stack system also includes electrical coupling means for connecting at least some of the conductor pads in the arrays of conductor pads on the first and second multichip packages when said electrical coupling means is located therebetween.

In another aspect, the present invention comprises a multichip integrated circuit package including a substrate having an upper surface and a lower surface. At least one liquid receiving cooling channel is disposed within the substrate so as not to intersect either the upper or lower substrate surfaces. A plurality of integrated circuit chips is disposed on the substrate's upper surface. Each chip has at least one interconnection pad on a top surface thereof. An encapsulant completely surrounds the integrated circuit chips and has an upper surface above the tops of the integrated circuit chips. The upper surface of the encapsulant has a plurality of via openings therein, at least some of the via openings being aligned with the interconnection pads. A pattern of interconnection conductors is disposed on the upper surface of the encapsulant so as to extend between at least some of the openings and so as to provide electrical connection between at least some of the interconnection pads through the openings.

Another aspect of the present invention comprises a heat sink structure for assembly with at least one multichip integrated circuit package. The structure includes a substrate having an upper surface and a lower surface which are in substantially parallel planes. At least one cooling channel is disposed within the substrate so as to extend substantially parallel to the planes of the upper and lower substrate surfaces. At least one metalized column is also disposed within the substrate. The metalized column is positioned so as not to intersect the at least one cooling channel and so as to perpendicularly intersect the planes of the upper and lower surfaces.

In yet another aspect, the present invention comprises a method for packaging integrated circuit chips. This method includes the steps of: providing a substrate having a plurality of metalized through holes therein; providing a pattern of conductors on the upper surface of the substrate, at least some of the conductors being electrically connected to selected ones of the metalized through holes in the substrate; depositing an insulating layer over the pattern of conductors and the upper surface of the substrate; disposing a plurality of integrated circuit chips on the insulating layer, the chips each including at least one interconnection pad; encapsulating the integrated circuit chips in an encapsulant material completely surrounding the chips and the upper surface of the insulating layer; providing a plurality of via openings in the encapsulant, the openings being disposed over at least some of the interconnection pads and at least some of the pattern of conductors on the upper surface of the substrate; and providing a pattern of electrical conductors on the encapsulant such that the conductors extend between via openings so as to electrically connect selected integrated circuit connection pads and selected ones of the pattern of conductors on the upper surface of the substrate.

In addition, the present invention comprises a method for packaging integrated circuit chips which includes the steps of: providing a substrate having substantially parallel flat upper and lower surfaces; disposing a plurality of integrated circuit chips on the upper surface of the substrate, the chips each including at least one interconnection pad; encapsulating the integrated circuit chips in an encapsulant material completely surrounding the chips and the upper surface of the substrate; providing a plurality of via openings in the encapsulant; the openings being disposed over at least some of the interconnection pads; providing a pattern of electrical conductors on the encapsulant such that the conductors extend between at least some of the via openings so as to electrically connect selected integrated circuit connection pads; providing a plurality of column openings in the encapsulant and the substrate, each of the column openings extending from an upper surface of the encapsulant to the lower surface of the substrate, at least some of the column openings being disposed so as to pass between the integrated circuit chips disposed on the upper surface of the substrate; and metalizing the column openings. Additional method enhancements are also described and claimed herein.

Accordingly, an object of the present invention is to provide a multichip module in a highly planar structure having enhanced resolution, reduced interference to the next level, reduced interference to a heat sink and the capability of stacking modules.

Another object of the present invention is to provide such a module structure and method of fabrication which provides high frequency operation, matched impedance of the interconnect, shielding of the interconnect, and short wires between all interconnect components of the module or the stack of modules.

Yet another object of the present invention is to provide a structure and method for removing generated heat in a stack of multichip modules.

Still another object of the present invention is to provide a structure and method wherein arrays of contact pads are provided on both the upper and lower surfaces of the modules to achieve maximum input/output capability.

A further object of the present invention is to provide interconnection conductors for a maximum number of integrated circuits associated with the propagation distance of one clock cycle.

A still further object of the present invention is to provide a stack of multichip modules wherein one of the modules can be removed and replaced either by mechanical means or simple high yield processing means. Related to this is a further object to provide stackable modules which can be tested before assembly.

A yet further object of the present invention is to provide a module stack of minimum weight and volume for an entire assembly.

Lastly, but not limited hereto, an object of the present invention is to provide the above-identified capabilities in a multichip module that is hermetically sealed.

BRIEF DESCRIPTION OF THE FIGURES

Subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIG. 9b is a plan view of two embodiments of a multichip module pursuant to the present invention for inclusion in the stack system of FIG. 9a;

FIG. 11b is a perspective view of the proper positioning of the structure halves of FIG. 11a;

DETAILED DESCRIPTION OF THE INVENTION

Two embodiments of the 3-D multichip module system of the present invention are described herein. The first embodiment is a multichip module stack with separate interconnect means (see, e.g., FIG. 1). The second embodiment is a multichip module stack with integral interconnect means (see, e.g., FIG. 6). The first structure is distinguished in that it can be assembled and disassembled in the field and it features a unique area array of pads which can cover the entire surface of both the top and bottom of the module. In the integral interconnect embodiment, the module is repairable at the factory but cannot be field disassembled. The distinguishing advantage of this approach is that no interconnect structure need be interspersed between adjacent multichip modules in the stack. By stacking a multiplicity of multichip modules together a high strength module can result event though the individual substrates are extremely thin and of relatively low strength. Finally, this structure results in the shortest possible interconnect distance between components of the multichip modules in the stack.

Another aspect of the present invention which is also described herein is a liquid cooled heat sink having through holes in the cooling fins. Structures and methods of fabrication are described for a separate heat sink, and for versions of multichip modules with integral heat sinks. 3-D stacks having heat sink building blocks are also described.

Figure 1:
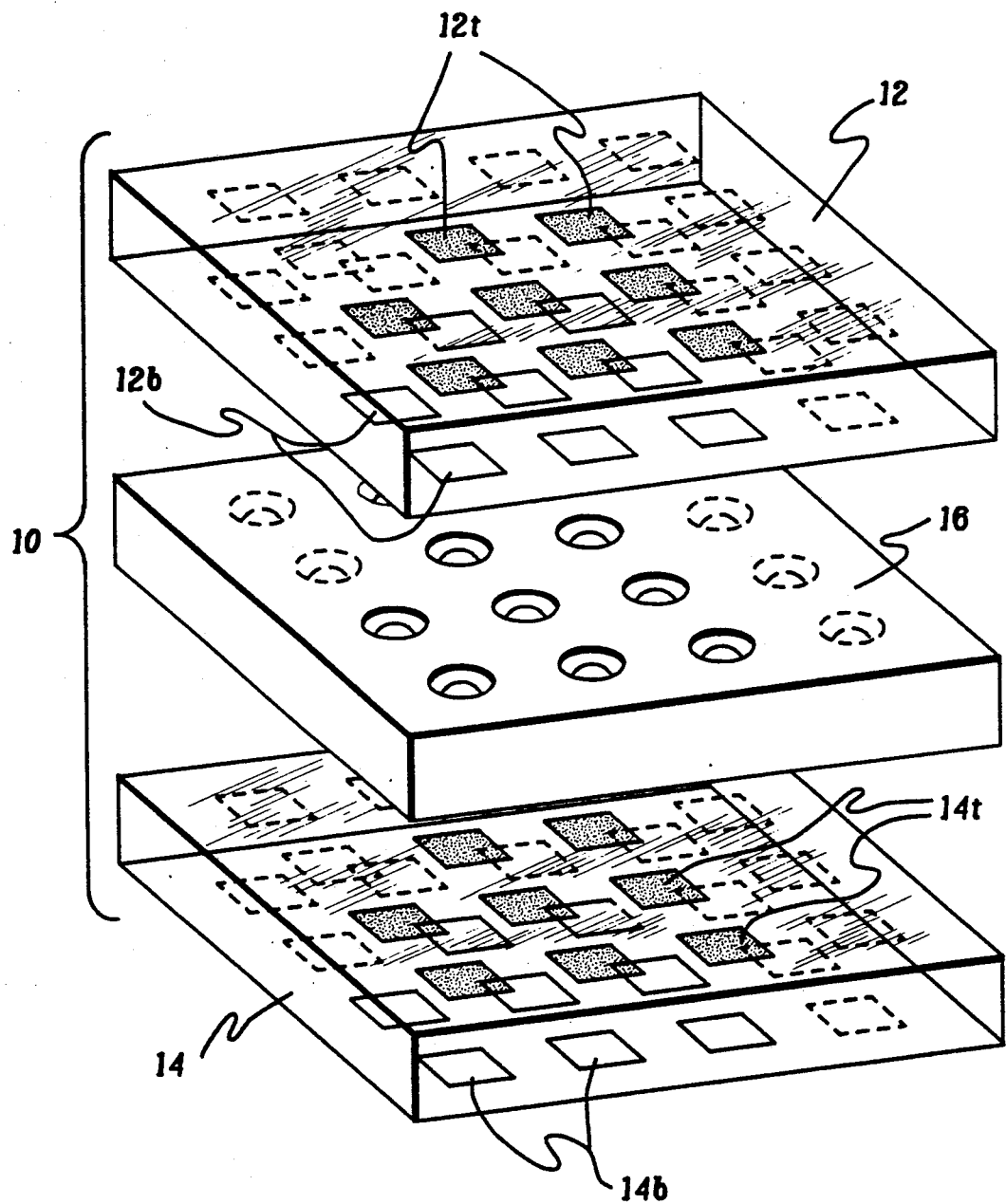
FIG. 1 is an exploded perspective view of a multichip module stack system in accordance with the present invention.

FIG. 1 shows in exploded view of a simple stack, generally denoted 10, of multichip modules having separate interconnect means, i.e., a button contact array interspersed between the adjacent modules 12 and 14. Note that each module 12, 14 in the stack 10 has an area array of pads 12t, 12b and 14t, 14b on both the top and bottom surface of the module. Interconnect between adjacent modules 12 and 14 is provided by an area array of button contacts 16 which makes contact from the pads 14t on the top of one module 14 to the pads on the bottom 12b of the next module 12.

Figure 2:
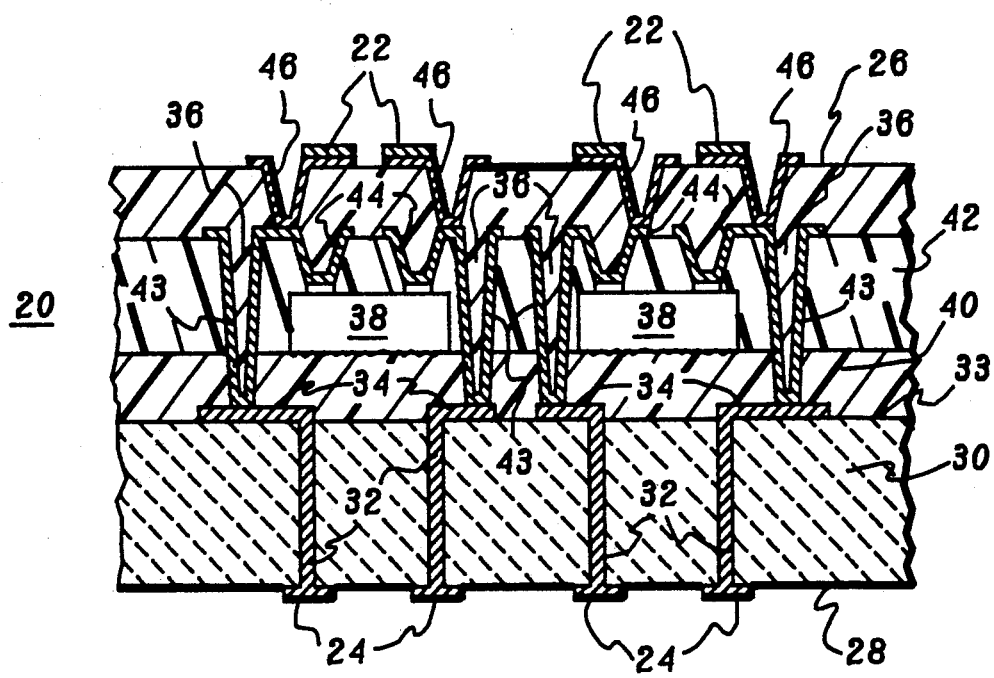
FIG. 2 is a cross-sectional elevational view of one embodiment of a multichip module in accordance with the present invention.

A multichip module with interconnected area array pads on the top and bottom surface thereof, and a method for fabricating the same, is now described. FIG. 2 depicts a multichip module 20 with area array pads 22 and 24 on the top 26 and bottom surface 28, respectively. The module includes a substrate base 30 with metalized via holes 32 through the base 30. On the bottom surface 28 of the substrate, pads 24 are provided for making contact to an adjacent lower multichip module (not shown). On the top surface 33 of the substrate base, distribution conductors 34 are provided which connect from the substrate vias 32 to the open area 36 between adjacent integrated circuit chips 38. An insulating layer 40 is provided over these conductors so that the IC chips 38 will not short circuit adjacent conducts 34 disposed thereunder. The IC chips are encapsulated 42 (e.g., with a polymer material) and connection 43 is provided from the conductors under the chips to conductors 44 over the chips. These connections 43 are provided in the space 36 between adjacent integrated circuit chips 38. The conductors 44 above the chips 38 provide interconnect between the ICs and interconnection 46 to arrays of pads 22 lying above the chips. Pads 22 can be used to make contact between this module and an adjacent module (not shown) positioned above module 20.

Those skilled in the art will recognize that the structure depicted in FIG. 2 hereof is merely provided by way example. Many modifications and substitutions can be made therein without departing from the present invention. For examples, numerous metallization patterns are possible. In particular, pads 22 and 24 may be only partially interconnected or not electrically connected at all. Further, various pad configurations on the upper surface and/or lower surface may be employed.

Figure 3A:
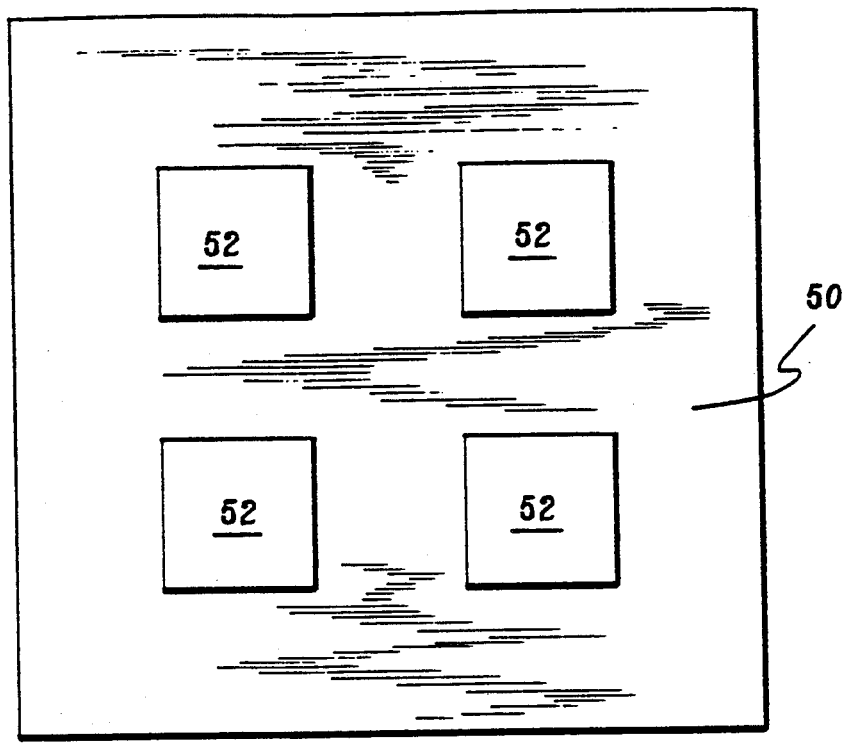
FIG. 3a is a plan view of a plurality of integrated circuit chips disposed on a substrate.

It is important to note some of the practical issues associated with this structure. The present state of the art for drilling holes in ceramic, such as the substrate base, and for providing commercially available button contact arrays (see FIG. 1) results in a best center to center space of approximately 20 mils. The only area available to pass interconnection from the bottom of the module to the top is the area between chips, since passing interconnection through the chips would required specially prepared chips. The area 50 between chips 52 is shown shaded in FIG. 3a. Polymer via hole technology has demonstrated reliable interconnects on a center to center spacing of 4 mils. The structure of FIG. 2 takes advantage of the higher pitch capability of polymer vias for making the interconnect between chips while enjoying the advantages of yield and commercial availability of wire pitch associated with feed through ceramic materials. Additionally, it is desirable to have large pads on relatively large spacing when making mechanical contact between adjacent modules. This allows reasonable mechanical tolerances to be achieved while still providing complete coverage of the substrate in an area array of pads. Note that the typical spacing for robust button contacts is 50 to 60 mils.

The fabrication process starts with the substrate base. Via holes can be provided in the substrate base by a number of methods. For example, substrates are available from Ceramic Process Systems (CPS) of Massachusetts which have holes in alumina or aluminum nitride blanks, which are filled with titanium tungsten conducting material. In an alternative embodiment, holes can be drilled in the substrate using a $CO_2$ laser. Substrates with holes drilled in pre-specified locations can be obtained from Laser Services Incorporated of Westford, Mass. Substrates with holes drilled through them or with filled holes are then placed in a sputtering chamber and sputtered with chrome or titanium and copper. The sputtering coats the entire top surface of the substrate and will also coat the hole if it is not filled. After one side of the substrate is coated, the substrate is turned over and the other side is coated. Typical sputtering conditions for a Balzers 450 sputtering machine are as follows: argon pressure of 1 to 2 mtorr, RF back sputter at 1,000 watts for three minutes followed by titanium sputtering at 2.2 kilowatts for eight minutes. This puts down a coating of approximately 1,000 angstroms. This is followed by sputtered copper at 2.2 kilowatts for eight minutes which puts down approximately 2,500 angstroms of copper. With copper on both sides of the substrate and in the holes, the substrate can be built up by conventional electroplating means. Electroplating conditions of 35 amperes per square foot with constant agitation can be used. An electroplating time of ten minutes results in approximately 8 microns of copper build up.

Figure 3B:
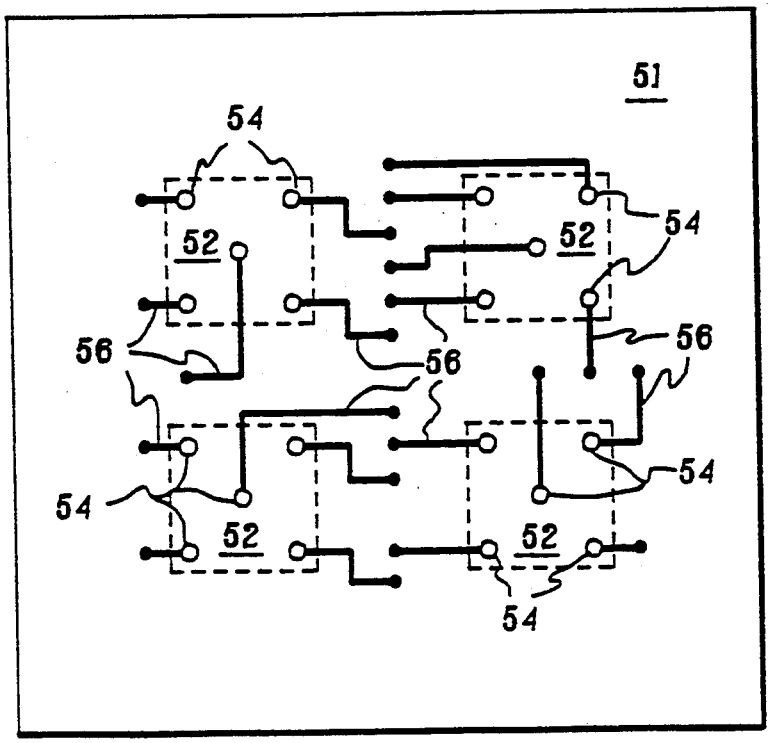
FIG. 3b is a bottom plan view of the assembly of FIG. 3a showing conductor connections.

Starting with a base substrate 51 with through holes 54 in an area array pattern, a conductor pattern 56 on the top surface of the substrate must be provided to distribute the area array of through hole 54 interconnects to locations between adjacent chips (see FIG. 3b). The location of each chip 52 is indicated in the figure by dotted lines on substrate 51. The conductor pattern 56 can be patterned during the pattern plating process which is used to build up copper in the through holes and to pattern contact pads (see FIG. 2) on the backside of the substrate base 51. When the pattern plating operation is complete, including plating of a thin layer of nickel followed by gold, the resist is stripped and the deposited seed layer is etched. At this point, a layer of dielectric (FIG. 2) is deposited on the top of the substrate base to insulate the distribution conductors 56 from the chips 52 which will be subsequently placed on the substrate base 51. A suitable dielectric material for this layer is ZOL1004 from Zeon Technologies of Nashua, NH. This material can be applied by spin coating at a speed of 4,000 RPM for a period of 20 seconds. The material is first UV cured with an energy of 5 joules per square centimeter and subsequently postbaked according to the following schedule: 10 minutes at 150° C. and 30 minutes at 220° C.

Figure 4:
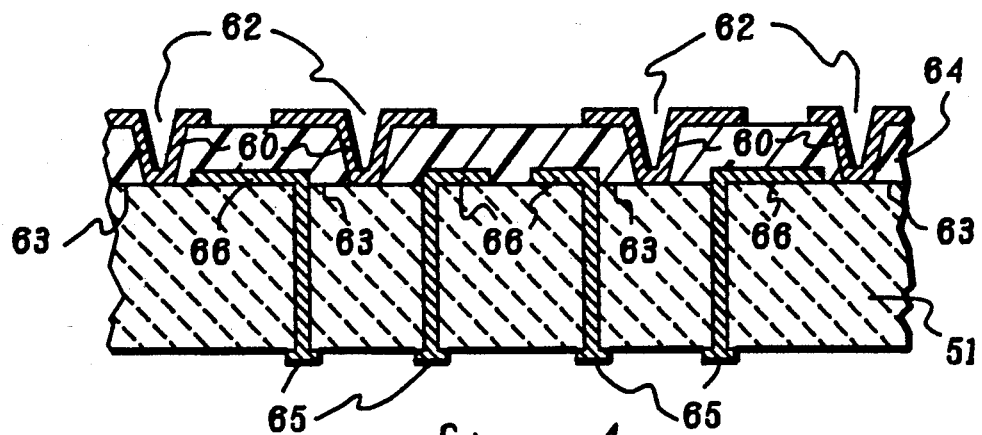
FIG. 4 is a cross-sectional elevational view of one embodiment of a substrate pursuant to the present invention having thermal vias disposed thereon.

Chips are then placed on the substrate base or, alternatively, provision can be made for a thermal via layer. As shown in FIG. 4, a thermal via layer 60 is provided by forming via holes 62 from the top of an insulating layer 64 to the substrate base 51. The via holes 62 can be formed as needed in all the spaces 63 between the conductor runs 66 which distribute from array pads 65 to adjacent chip spaces. The via holes are formed using an Excimer laser with focused energy density of 1 to 2 joule per centimeter squared. At the light wave length of 248 nanometers approximately 100 pulses are required to ablate reliably through 1-2 mil of dielectric insulating material. After via hole 62 formation to the substrate surface, the holes are metalized by sputtering 1,000 angstroms of titanium followed by 3,000 angstroms of copper. The copper is then pattern plated to increase its thickness and to provide open areas in the spaces between adjacent chips so that subsequent contact can be made to the distribution conductors 66.

By pattern plating the copper to a thickness of 1 mil the copper can act both as a thermal via and as an effective heat spreader for distributing the heat load from the chips to be attached (not shown). By grounding this conductor layer or connecting it to an AC grounded reference voltage, this layer forms a strip line with the distribution conductors 66 and can be used to provide shielding from cross talk and constant impedance to these lines. At this point, the module is ready for continued fabrication using the methods and structure disclosed in the cross-referenced application entitled "Multichip Integrated Circuit Module and Method of Fabrication."

According to the process described therein, chips are thinned to a predetermined thickness and affixed to the substrate using a die attach material which is coated to a well controlled thickness. The chips are placed according to reference features on the chips themselves. Special methods are used as disclosed to insure that the chips are accurately placed and maintain their accurate positioning throughout the curing cycle of the die attach. Subsequently, the chips are encapsulated in a polymer encapsulant and the surface of the encapsulant is planarized by lapping or other suitable method. Via holes are formed in the encapsulant, preferably using an Excimer laser.

Processing pursuant to the present invention differs from the basic advanced multichip module fabrication methods already disclosed in the cross-referenced application in that via holes are formed both to pads on the chips and to distribution conductors (e.g., 34 in FIG. 2) in the area between the chips. In a preferred method of fabrication, the via holes to the chip pads are first drilled using an energy density of 1 to 2 joules per square centimeter. The energy to form via holes from the top to the bottom of the encapsulant can be increased substantially because the metallization underneath is thick and capable of diffusing substantial amounts of energy. By increasing the energy to 5 joules per square centimeter the drilling rate can be tripled. Typically, 100 pulses is needed to drill through 2 mils of polymer material using 1 to 2 joules per square centimeter. This rate is tripled to 6 mils with 150 pulses using 5 joules per square centimeter. After the holes have been drilled the via holes are metalized by sputtering as described in the cross-referenced application. The metallization is patterned by applying a resist, exposing and developing the resist, and etching the metallization.

Pursuant to this invention, the method of resist application also differs from that disclosed in the referenced application entitled "Multichip Integrated Circuit Module and Method of Fabrication." Specifically, a method must be provided to protect the deep via holes which span the thickness of the encapsulant in the areas between chips. A method which produces satisfactory results is to double or triple coat the resist using AZP4620. The following procedure is used. The first coat is applied and spun at a speed of 1,500 RPM. This coat is baked for five minutes at 80° C. A subsequent layer is then spun at a speed 1,500 RPM and baked for five minutes at 80° C. A third coat, if desired, is spun at 1,500 RPM and baked five minutes at 80° C. and ten minutes at 100° C. The final bake at 100° C. would be provided if only two layers of resist are desired. This procedure fills the deep holes with resist without incurring an undo resist thickness on the surface of the module. Patterning of the resist is achieved by exposure to UV light at an energy density of 500 mjoules per square centimeter. The resist is developed in a one part developer, three part water solution of AZP4620 developer available from HOECHT CELANESE. The titanium-copper-titanium sandwich is then etched as previously disclosed and the resist stripped with acetone. Subsequent layers are added by spin or spray coating a polymer dielectric and repeating the process of via hole formation and metal deposition.

The final interconnect layer to be added to the structure is used to provide a pad array on the top surface of the multichip module (see FIG. 2). The pads in this pad array are preferably distributed with the same spacing as the pads in the pad array on the bottom of the substrate base. In this way, connection can be made from the top of one multichip module to the bottom of the substrate base associated with an adjacent multichip module in a stack, e.g., by using the described button contacts available from Cinch Inc. FIG. 2 shows the structure of a substrate with electrical through holes used as a substrate base and an advanced multichip module built on that base with the last (top) layer of the structure used to provide an area array of I/O pads 22 for connection to the next level. The processing steps necessary to provide the pad array structure are described below. After the appropriate interconnect layers have been provided, a layer of dielectric is applied to the module by spin or spray techniques. ZTI1004 can be used at a spin speed of 1,500 RPM for a period of twenty seconds. This material is then cured under UV light with an energy of 2 joules per square centimeter. The material is postbaked at 150° C. for five minutes and 220° C. for a period of twenty minutes. Following postbake, via holes are formed to the interconnect layer beneath using an Excimer laser as described earlier. Metallization is applied as described earlier in which titanium is sputtered to a thickness of 1,000 angstroms and copper is sputtered to a thickness of 3,000 angstroms. At this point, the module is removed from the sputtering chamber and coated with a thick coating of photo patternable resist. A negative acting resist type F360 can be used. This material is available from Chem Line Industries of Lancaster, PA. The resist is spun at a speed of 1,500 RPM for a period of twenty seconds. The resist is baked for twelve minutes at 100° C. The resist is patterned using an exposure energy of 100 mjoule per square centimeter and a development time of 100 seconds in a 1% sodium carbonate solution. This leaves the area where pads are desired exposed.

Electrical connection is then made to the metal of the substrate and electroplating of copper proceeds. An electroplating current of 35 amperes per square centimeter for a time period of forty minutes is used to achieve a total thickness of electroplated copper greater than twelve microns. After copper plating, the assembly is plated in a nickel bath to build up the thickness of nickel to approximately 100 micro inches and to provide a barrier between the nickel and the gold which will subsequently be plated. After nickel plating, the substrate is rinsed and placed directly in an acid gold plating bath such as that available from Transene Incorporated. Gold is plated to a thickness of at least fifty micro inches. After gold plating, the resist is removed by dipping the substrate in a 5% ammonium hydroxide solution for a period of one minute. The substrate is rinsed, and placed in a copper etch consisting of one part ferric chloride and ten parts deionized water. This etch takes place for a period of thirty seconds to remove the background copper and leave only titanium exposed. The titanium is etched in a one to twelve solution of TFT etch available from Transene Corporation. At this point, an environmental coating is added which coats the entire top surface of the module except for openings provided above each I/O pad.

It should be noted that the structure of FIG. 2 can be used in a stack configuration where each module is connected to the next adjacent module using an external interconnect means such as button contacts. FIG. 1 shows an example of such a stack of modules. This configuration is particularly unique in that the module stack can be disassembled for repair or incorporation of additional or different modules. This disassembly can easily be achieved in field use.

Structures and methods for implementation of 3-D stacks of multichip modules without the need for external interconnect means are described next. The characteristic that ties together the various structures and methods set forth herein is the use of through holes for interconnecting the module stacks.

Figure 5:
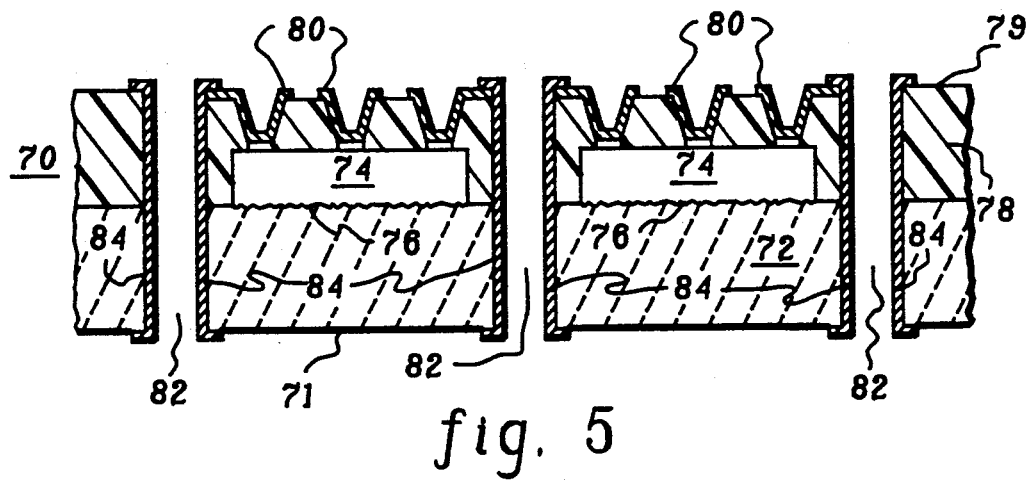
FIG. 5 is a cross-sectional elevational view of another embodiment of a multichip module pursuant to the present invention.

FIG. 5 depicts a single multichip module 70 suitable for stacking according to the present invention. Module 70 is first fabricated according to the fabrication methods disclosed in detail in the cross-referenced patent application. The process starts with a flat substrate 72 on which chips 74, which have been thinned to a predetermined thickness, are placed using a die attach material 76 which is coated to a well controlled thickness.

The chips 74 are placed according to reference features on the chips themselves. Special methods (as disclosed in the referenced application) are used to ensure that the chips are accurately placed and maintained in their accurate positioning throughout the curing cycle of the die attach. Subsequently, the chips are encapsulated in a polymer encapsulant 78 and the surface 79 of the encapsulant is planarized by lapping or other suitable methods. Via holes are formed in the encapsulant and metallization 80 deposited and patterned to effect an interconnect between the integrated circuit chips 74 on the substrate 72. Subsequent layers (not shown) are added by spin or spray coating a polymer dielectric and repeating the process of via hole formation and metal deposition and patterning.

At this point, the multichip module is exactly as described in the incorporated application entitled, "Multichip Integrated Circuit Module and Method of Fabrication." To adapt this module for stacking in a 3-D interconnect fashion, through holes 82 are added to the basic module. As can be seen in FIG. 5, the through holes 82 penetrate from the top surface 79 to the bottom surface 71 of the module 70. Each through hole is metalized 84 on the inside and makes electrical connection to the metallization 80 which forms the interconnect in the multichip module. The presently preferred method of forming the through holes is to drill the holes using a high powered laser in the pulsed mode. One can use either a YAG laser or a $CO_2$ laser. Appropriately sized holes can also be formed in fabricated multichip modules by using a laser machining service such as provided by Laser Services Incorporated. Using a module of total thickness of 30 mils, Laser Services can routinely provide holes of 10 mil diameter at locations accurately positioned relative to fiducial marks on the multichip module. Once the holes have been formed the module is subjected to a plasma cleaning cycle which removes debris from the hole drilling process. A suitable cycle is fifteen minutes in an LFE 1000 plasma etch system using 30% $CF_4$ in oxygen and a power level of 1,000 watts. This plasma cleaning step also exposes the metal pattern on the multichip module so that good electrical connection can be achieved between the metal pattern and the through holes.

The module with through holes is next placed in a sputtering chamber and metal is sputtered over the surface of the module and in the through holes. Typical sputtering conditions for a Balzers 450 are as follows: argon pressure of one mtorr for all sputtering operations, back sputter at 1,000 watts RF for a period of two minutes, this is followed by magnitron sputtering at a power level of 2,200 watts, titanium metal for a period of eight minutes which puts down a 1,000 angstrom coating. This is followed by 2,200 watts for a period of thirty minutes of magnitron sputtered copper. This metal coating serves to provide a seed layer on which subsequent plating can occur. In standard plated through hole technology, the seed layer is provided by depositing a very thin layer of palladium from a low concentration solution.

Before the build up of the metallization in the holes, photoresist is applied to the top and bottom surface of the module and patterned to expose the through hole area and any other area where a conductive pattern is desired. Such other area may include, for example, patterns for additional conductors to interconnect the module signal lines and a power line as well as area for thermal vias. In a preferred embodiment, the resist is RISTON ® dry film resist, available from Dupont. This resist has the advantage that it can be coated on both sides of the module in the same operation. These resist and patterning techniques are well known in the plated through hole printed circuit art. The resist is applied by pinch roller laminating techniques. Once the resist has been exposed and developed, the metal is built up in the desired areas by electroplating copper.

Figure 6:
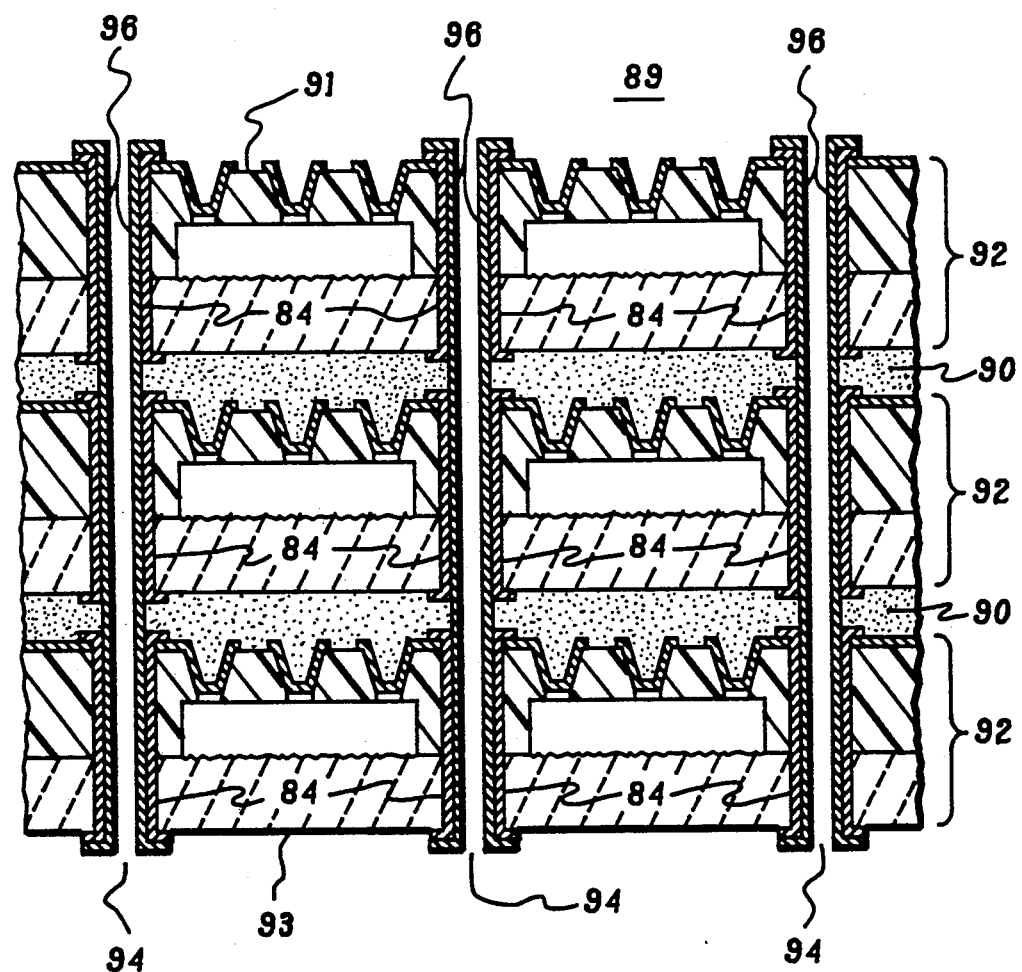
FIG. 6 is a cross-sectional elevational view of one embodiment of a multichip module stack system in accordance with the present invention which incorporates therein the module of FIG. 5.

The process proceeds as follows: a one minute dip in Nutra Clean, available from Shipley Company, to clean oxide from the surface of the copper seed layer. This is followed by a rinse and subsequent insertion in the plating bath while the substrate is still wet. This ensures the best adhesion of the electroplated copper to the seed layer. A thickness of a least 12 microns is built up to ensure that the side walls of the hole are adequately covered and also to provide good copper volume for the thermally conductive thermal vias (See FIG. 4). At this point, a protective layer of gold is plated over the copper using first a barrier layer of nickel followed by a thin layer of gold, according to processes which are well known for the plating of fingers on the edges of printed circuit cards. The gold layer serves as a protective coating for the through hole and is preferred if the subsequent module stack is to be repairable. At this point, the resist is stripped, and the module rinsed and dried. The module is then ready for incorporation in a stack of like processed modules. FIG. 6 is a cross-sectional view of a plurality of stacked modules.

Before assembling the multichip modules into a stack 89 such as shown in FIG. 6, each module 92 is coated with a thermoplastic adhesive 90. Since the modules produced by the methods disclosed in the cross-referenced application are extremely flat, the thickness of the adhesive line can be relatively thin. A typical thickness required is 12 microns. That is conveniently coated on the top surface of the module by spin or spray coating techniques. In a presently preferred embodiment, ULTEM 1,000 resin is used as the thermoplastic adhesive. This resin can be coated from a solvent solution. A solvent consisting of 50% NMP and 50% methylene chloride can be used. For spin coating, 20% by weight of the ULTEM resin can be dissolved in the solvent. After coating, the solution is dried in stages starting at 100° C. for twenty minutes, then 150° C. for twenty minutes and, finally, 220° C. for twenty minutes. At this point, the modules 92 can be laminated together.

The modules are first aligned so that their through holes 94 are in good alignment. The modules are then pressed together in a laminating press at a pressure of 20 lbs. per square inch and a temperature of 280° C. This causes the thermoplastic adhesive to flow and wet the adjacent surface of the next multichip module in the stack 89. It should be noted that some of the thermoplastic adhesive will flow into the through holes 94. To remove this excess adhesive, an Excimer laser is used operating at a fluency of between 1 and 2 joules/cm$^2$ per pulse and a wave length of 248 nanometers. The polymer residue is removed while the metal 84 in the through holes remains intact.

At this point, the holes in each module are aligned but are separated and insulated by the thermoplastic adhesive. The stack of modules is plasma etched to complete the process of cleaning up the residue of thermoplastic adhesive. The plasma etch step is as described before using an LFE plasma etching machine. At this point, the through holes 94 are ready for final metallization 96. This can be done by palladium seeding followed by electroless plating techniques as are well known in the plated through hole printed circuit industry, or by sputter coating as described earlier in this section. Once the seed coat has been applied the stack of modules is resisted and patterned to expose only the holes and desired interconnect pattern on the top surface 91 and bottom surface 93 of the module stack 89. The through holes are then built up by electroplating, a well known process in the plated through hole art. Finally, each hole is coated with solder plate or gold plate in order to protect the copper from oxidation and to provide etch resistance against the etch used to remove the seed layer. At this point, the resist is stripped and an appropriate etch which attacks copper but does not attack either the gold or solder plate layer is used. For example, copper chloride or ammonium persolfate etches are available in the industry for this purpose. The resultant stack of modules is interconnected by the through holes.

An advantage of the module stack as described above is that pads (not shown) can be provided on the top and bottom surfaces during the hole plating operation. These pads can be used for input/output from the stack. In addition, the stack of modules can be repaired by a relatively simple procedure. In the repair procedure, the stack of modules is subjected to an etch which etches the gold or solder plate protective layer. The stack is then placed in an etch which attacks the copper but will not attack the gold plate. Ferric chloride can be used as such an etch. When the copper is etched away the area between the modules of the stack will no longer have a metal coating. However, the through holes of each module will still be coated with metal because they are protected by the layer of protective gold plate. As a result, modules can be separated by heating the stack to the melting point of the thermoplastic adhesive 90 and separating the stack at the point where module replacement is required. The other modules in the stack can remain intact. A replacement module coated with the thermal plastic adhesive can then be incorporated in the stack and the above-described process of lamination, hole cleaning and subsequent metallization can be repeated to achieve a fully functional, repaired module stack.

Figure 7:
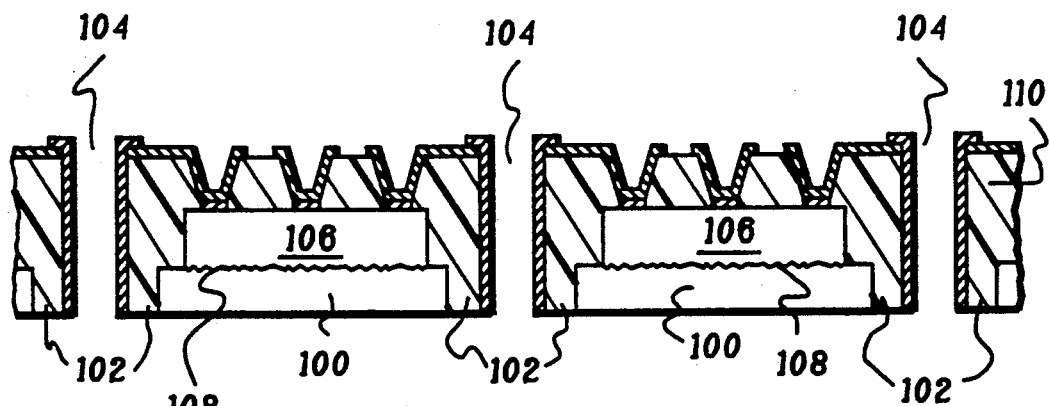
FIG. 7 is a cross-sectional elevational view of another embodiment of a multichip module pursuant to the present invention.

In an alternate embodiment of the present invention, the 3-D stack described above with through hole interconnects can be fabricated using modules with very thin substrates, such as shown in FIG. 7. Several advantages can be obtained with this structure. First, since each module is very thin, the number of modules in the stack which can be achieved before the aspect ratio of the through holes exceeds practical limits is maximized. Second, since the substrate is very thin the heat transfer through the substrate results in very low thermal drop there across. This in turn allows a larger number of modules to be stacked together before a heat sink (such as described below) is necessary. Finally, in special applications where volumetric efficiency is a consideration this structure has extremely high volumetric efficiency because the ratio of substrate volume to total volume is very small.

The structure depicted in FIG. 7 and a method of fabrication thereof, along with the differences between the thin multichip module stack and the multichip module stack described above, is next described. If the substrate material were alumina or aluminum nitride thinned to a very small cross section the structure would look identical to the structure described in the previous section. However, the practical limits associated with the brittleness of thin ceramic substrates require that the substrate thickness exceed several mils. For the thinnest substrates a metal substrate is required since the metal substrate is ductal and not subject to brittle failure. Metal substrates on the order of 1 to 2 mils thick can readily be achieved in this structure.

Referring to FIG. 7, the only significant difference between the metal substrate 100 and the ceramic substrate described above is that insulation 102 must be provided between the through holes 104 and the electrically conducting metal substrate. In a presently preferred method, the metal substrate is molybdenum. This metal sheet, between 1 and 2 mils thick, is adhesively bonded to a carrier (not shown) before chips 106 are attached. The adhesive used is a thermoplastic such as ULTEM 1000. This adhesive is coated to a carrier which provides a flat rigid substrate for subsequent processing and also can be used to carry more than one substrate. The preferred carrier is a glass plate approximately 100 mils thick. The molybdenum substrate is laminated to the adhesive coated carrier in a conventional laminating press at a pressure of 100 lbs. per square inch and a temperature of 280° C. for a period of five minutes.

After lamination, the molybdenum substrate is coated with resist and patterned with open areas where the through holes will be. These open areas are slightly larger than the actual size of the through holes. The molybdenum is etched in a 10% nitric acid solution in water. After etching, the resist is removed. Resist type AZP4620 can be used and acetone can be used to strip the resist. AZP4620 is available from HOECHT-CELANESE. At this point, die attach material 108 is spun on the substrate and dried as described in the cross-referenced patent application. Chips are placed in the die attach material which is first UV exposed to hold the chips in place and subsequently thermally cured to wet the backs of the chips and effect a complete curing. At this point, die attach material is partially filling the holes previously etched in the molybdenum. Processing of the circuit now proceeds in exactly the fashion disclosed in the previously mentioned application. The encapsulant 110, which can be ZOL1004, is spin coated on the substrate at a speed of 400 RPM for a period of ten seconds. The encapsulant material is then UV cured in a flood UV system at an energy level of 4 joules/cm². The encapsulant is baked for five minutes at 150° C., and twenty minutes at 220° C. and then lapped flat using diamond stop lapping techniques as described in the incorporated application. Through holes 104 are formed in the encapsulant using Excimer laser drilling techniques. Metallization is applied by sputtering titanium followed by copper followed by another thin layer of titanium and the metal patterned using ordinary photoresist techniques.

Subsequent layers (not shown) of dielectric can be applied and cured, via holes formed and additional metallization deposited and patterned to form the entire circuit. The through holes are formed at the point where the last electrically conducting layer is to be formed on the module being fabricated. After the last dielectric layer is deposited and cured, via holes are normally drilled with the use of Excimer laser ablation. At this point, through holes can also be formed using the same Excimer laser ablation. These holes are located on the same centers as the holes etched in the molybdenum substrate. The holes formed are smaller than the holes in the substrate so that the substrate does not electrically short metallization in the through holes. Through holes 4 mils in diameter can easily be formed in polymer materials used for encapsulant and dielectric interlayers when the total thickness is on the order of 6 to 10 mils.

A typical fluency of 2 joules per square centimeter on the hole area to be ablated results in relatively short hole forming times. A wave length of 248 manometers assures absorption in all of the polymers used for dielectric materials and gives good energy, power and gas lifetime performance from the Excimer laser. The technique for metalizing the hole and for patterning the metal in the top layer of the module is the same as described in the previous section, including the forming of thermal vias (i.e., if desired) at the same time and coating of the metal surfaces with a protective gold plate so that subsequent repair operations can be effected.

At this point, the modules are completed and ready for removal from the carrier. This is done by first using the Excimer laser to ablate the encapsulant material and dielectric from the areas between adjacent modules on the carrier. This operation is carried out using an Excimer laser energy of 5 joules per square centimeter and using a line aperture so that a line of material can be removed at one time. The part is then scanned under the laser until material between adjacent modules has been removed. At this point, the carrier is placed on a hot plate operating at 280° C., which is the melting point of the adhesive material. As soon as the carrier reaches this temperature, the individual modules can be slid from the carrier. Residual Ultem adhesive can be removed from the back of the modules by a 15 to 30 second dip in methylene chloride or by using a cloth wet with methylene chloride.

Figure 8:
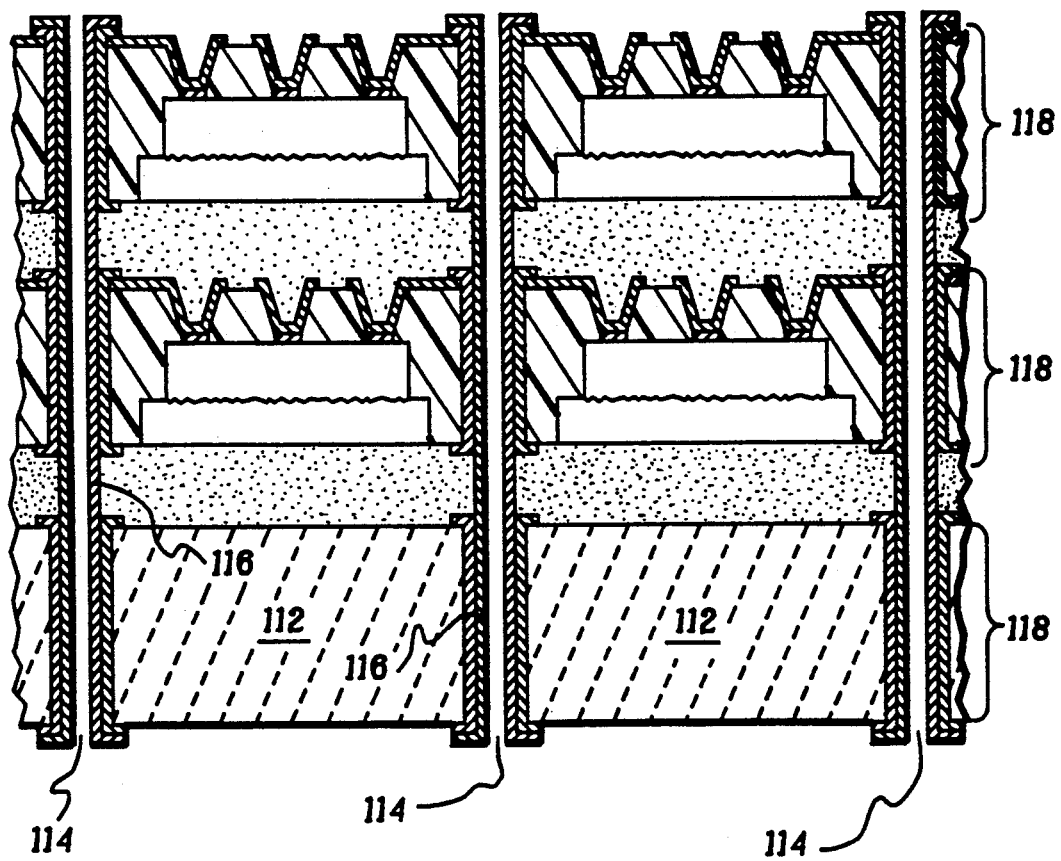
FIG. 8 is a cross-sectional elevation view of a multichip module stack system in accordance with the present invention.

At this point, the individual modules are ready for testing and subsequent assembly into a stack. Extra strength can be provided in the stack by using a rigid base plate, 112 for example, of alumina or aluminum nitride which has holes 114 formed in it by laser drilling techniques as described above (see FIG. 8). These holes are subsequently metalized as described, thus forming a base plate with plated through holes 116 which line up exactly with the holes in the modules 118. A base plate adds strength and rigidity to the structure. The lamination and subsequent metallization of the through holes proceeds as already described with the base plate at the bottom of the stack. It should be noted that because the modules produced by this method are less than 10 mils thick, a larger number of modules can be stacked together before practical aspect ratios in through holes are exceeded. A practical aspect ratio which is relatively easily achieved is 20 to 1 for the hole diameter to total length of the through hole.

Two factors limit the number of modules which can be stacked together using the through hole method of interconnect. These two factors are thermal rise in the topmost modules and the aspect ratio achievable with the through holes. The thin module structure depicted in FIGS. 7 and 8 optimizes both conditions. For example, the thickness of a single module can be determined by considering the substrate thickness as 2 mils, chip thickness 6 mils and associated above the chips circuitry at a thickness of 2 mils, resulting in a total module thickness of 10 mils. Assuming a 10 mil diameter through hole the number of possible modules which could be stacked can easily be determined given a practical aspect ratio for the through holes of 20 to 1. This would result in a total thickness of the stack of 20 times the diameter, or 20 times 10 mils. Allowing 20 mils thickness for a rigid base plate (112) the total number of modules of a 10 mil thickness which could be stacked is 18 modules.

It should be noted that a 10 mil diameter through hole can be placed between adjacent chips while only increasing the theoretical density of the module by approximately 10% in practical circuits with chips 200 to 300 mils on a side. Assuming chips 300 mil on a side and 20 mil center to center spacing on through hole interconnects, a number of through hole interconnects on the order of 1,000 can easily be attained. This is more than sufficient for most systems, especially including memory systems. This calculation is predicated on relatively conservative assumptions about the diameter and spacing of the through holes so that high reliability and ease of processing will be assured.

The second limiting criteria on the number of modules which can be stacked is the thermal drop due to the heat flux through the module stack. It is necessary in this approach that heat flows from the topmost module through all other modules to a heat sink (not shown) at the bottom of the stack. This criteria defines the largest number of modules which can be stacked together before a heat sink must be interspersed. The calculation of thermal resistance for the IC chip die attach and substrate is straightforward and involves only the application of the general formula for thermal resistance. Thermal vias require some additional consideration In the thermal resistance calculation for thermal vias it is assumed that the thermal vias cover 10% of the surface of the module. This is a reasonable assumption from the standpoint of the remaining area required for interconnection of the circuitry. In addition, the most convenient way to fabricate thermal vias is to form them in exactly the same way as the electrical vias are formed. As a practical example, the outside dimension of the via may be approximately 25 microns while the thickness of the copper plate therein is 6 microns. The total area of the via which is copper (in this example) can be determined by subtracting that area of the via which does not contain copper from the total area of the via.

From the calculations, it can be seen that approximately 25% of the area is not filled with copper while the remainder is, thus resulting in an unfilled via having 75% of the volume of a totally filled thermal via. This factor is incorporated in the thermal via resistance calculation. The total thermal resistance is determined by adding the contributions from each of the elements in the module. Where modules are stacked together the total thermal drop from the top module to the heat sink is given in equation (1), where $\theta$ is the thermal resistance and N is the number of modules in the stack.

$$\Delta T = \frac{W}{cm^2} (\theta)(N(N-1)(N-2)(N-3)\ldots 1) \quad (1)$$

case 1: Watt/cm$^2$; 18 module stack $$\Delta T = \frac{1W}{cm^2} (0.1)(171) \Big|_{N=18} = 17.1° C.$$

case 2: 10 Watts/cm$^2$; 5 module stack

-continued $$\Delta T = \frac{10W}{cm^2} (0.1)(15) \bigg|_{N=5} = 15^\circ C.$$

In this equation, it is assumed that the number of watts per square centimeter dissipated is the same in every module. For a given configuration, the maximum number of modules in the stack is determined by the allowable thermal drop and the number of watts per square centimeter in each module. Two cases are considered, one in which the number of watts per square centimeter in the module is 1 watt, and the other where the number of watts per square centimeter is 10 watts. In the a thermal drop of 17° C. In the second case, 5 modules can be stacked and will result in a thermal drop of 15° C.

It can be seen that stacks of 18 to 20 modules can be attained using relatively conservative design rules as long as power levels are kept reasonable. One system where power levels would be dramatically below 1 watt per centimeter square is static memory. It is expected a major application of this particular stack will be very high bit count memory systems. In these systems, the advantage of incorporating memory controllers and input output buffering as well as limiting wiring length makes this approach particularly attractive for packaging large amounts of memory. In addition, systems involving multiple processors accessing the same memory can also be configured in this system where the processors typically occupy the modules in the stack closest to the heat sink. Multi processor systems which require very high interconnectivity among processors and memory resource can be reliably implemented by this approach yielding a very high performance in a small space.

Figure 9A:
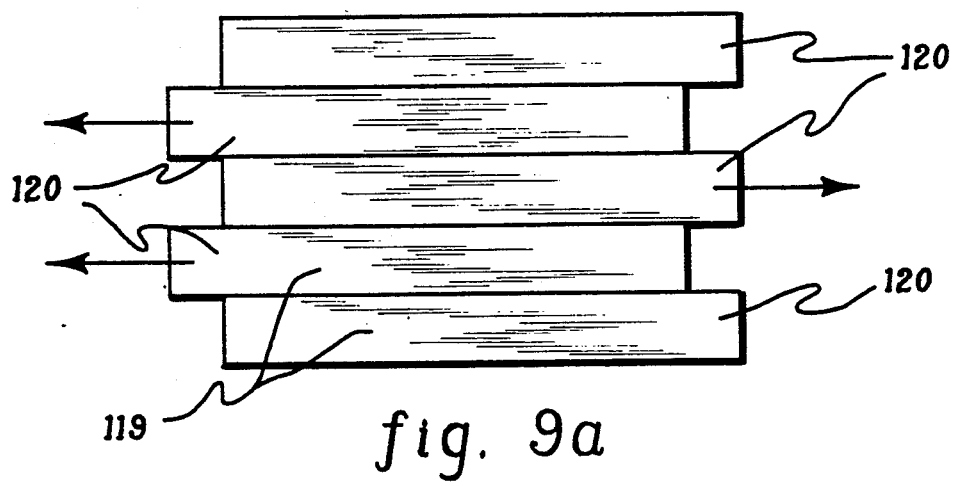
FIG. 9a is an elevational view of one embodiment of a multichip module stack system pursuant to the present invention.
Figure 9B:
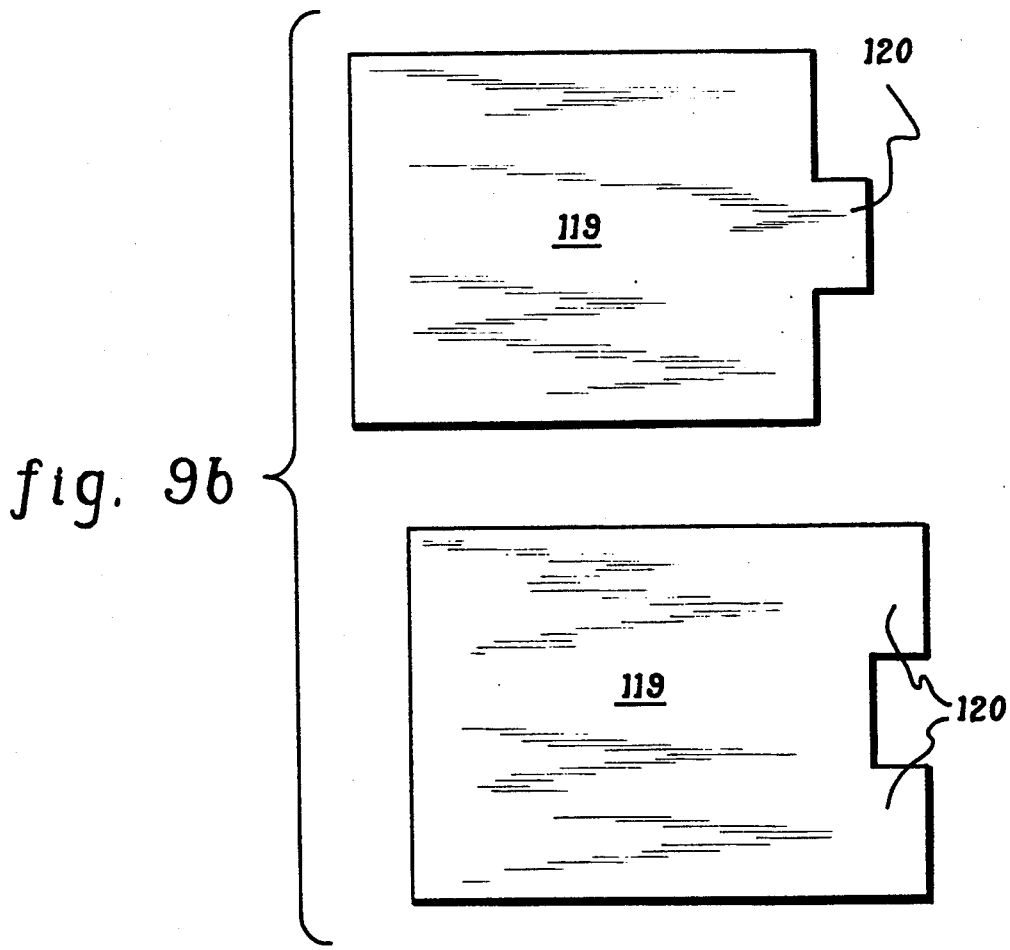

Repair of module stacks of thin modules proceeds exactly as repair of the thicker modules with through hole connections with one exception. Since the individual modules are on a substrate which is flexible a method is provided which does not torque the individual modules during the repair process. According to the method, which is depicted in FIGS. 9a and 9b, individual modules 119 are provided with tabs 120 at their edges such that the edge of the module to be replaced can be engaged, along with the edges of the modules above and below this module.

At this point, the module stack can be heated to the melting point of the adhesive and the module to be removed can be slid from between the two adjacent modules. This puts very little stress on the other modules and prevents them from becoming misaligned. It can be seen from FIGS. 9a and 9b that every other module preferably has a tab which faces in the opposite direction. In addition, tabs are provided alternately on the outside corners and towards the inside of the modules. This gives a sufficient space to allow a strong grip to be obtained during the repair process without interfering with adjacent modules. The tabs are provided on the modules by leaving an area on each module where there is no circuitry. At the end of processing, the Excimer Laser is used to ablate the polymer from the area of the tab. The tabs can be preformed in the substrate to provide the outside corner and inside corner by conventional stamping or photo etching techniques. In a presently preferred embodiment, tabs are formed at the same time as the oversized holes are photo etched into the substrate material.

Certain novel separate and integral heat sink structures and methods of fabrication pursuant to the present invention will now be described.

The module stacks described above require that heat flows from the topmost module through the other modules in the stack to a heat sink. In many applications the watt density of the components in an individual module is sufficiently high that an individual heat sink is required for each module (or at least selected ones of the modules). The following discussion describes certain structures and fabrication methods for individual modules with integral heat sinks which can be connected in 3-D module stacks. In addition, the heat sink fabrication method set forth yields a generic heat sink which provides a combination of a liquid cooled heat sink and an area array of through electrical vias.

Figure 10:
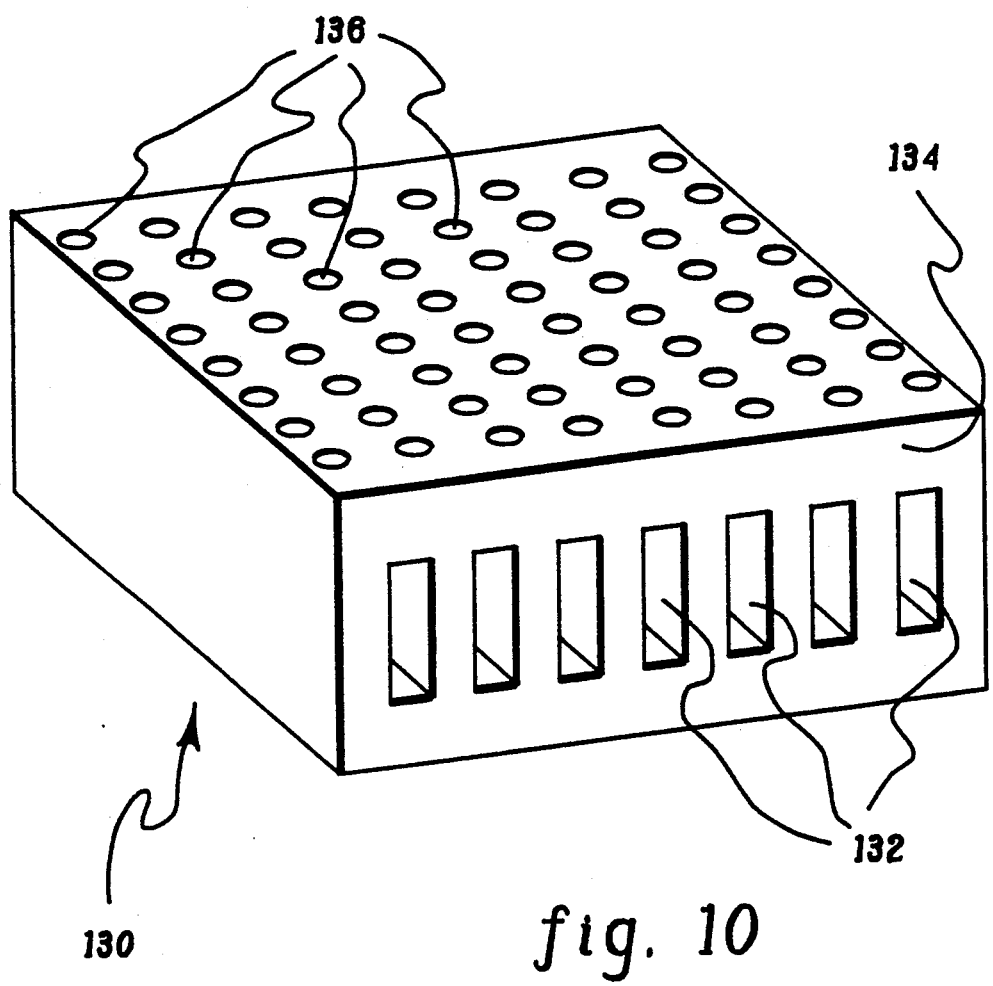
FIG. 10 is a perspective view of one embodiment of a heat sink in accordance with the present invention.

In order to take maximum advantage of the stacking of modules it is necessary to have a heat sink which performs both the function of heat removal and also provides an array of thru holes in order to interconnect the elements below the heat sink to elements above the heat sink. FIG. 10 depicts a structure for a liquid cooled heat sink which also provides a high density array of electrical thru holes.

In the basic structure 130, channels 132 are provided through a base plate 134 material. These channels carry the liquid cooling medium (not shown). Metallized holes 136 are provided through the base plate material in areas where there are no liquid channels. When the through holes 136 are made electrically conducting, then the combined function of liquid cooled heat sink and top to bottom electrical interconnect is achieved.

Figure 11A:
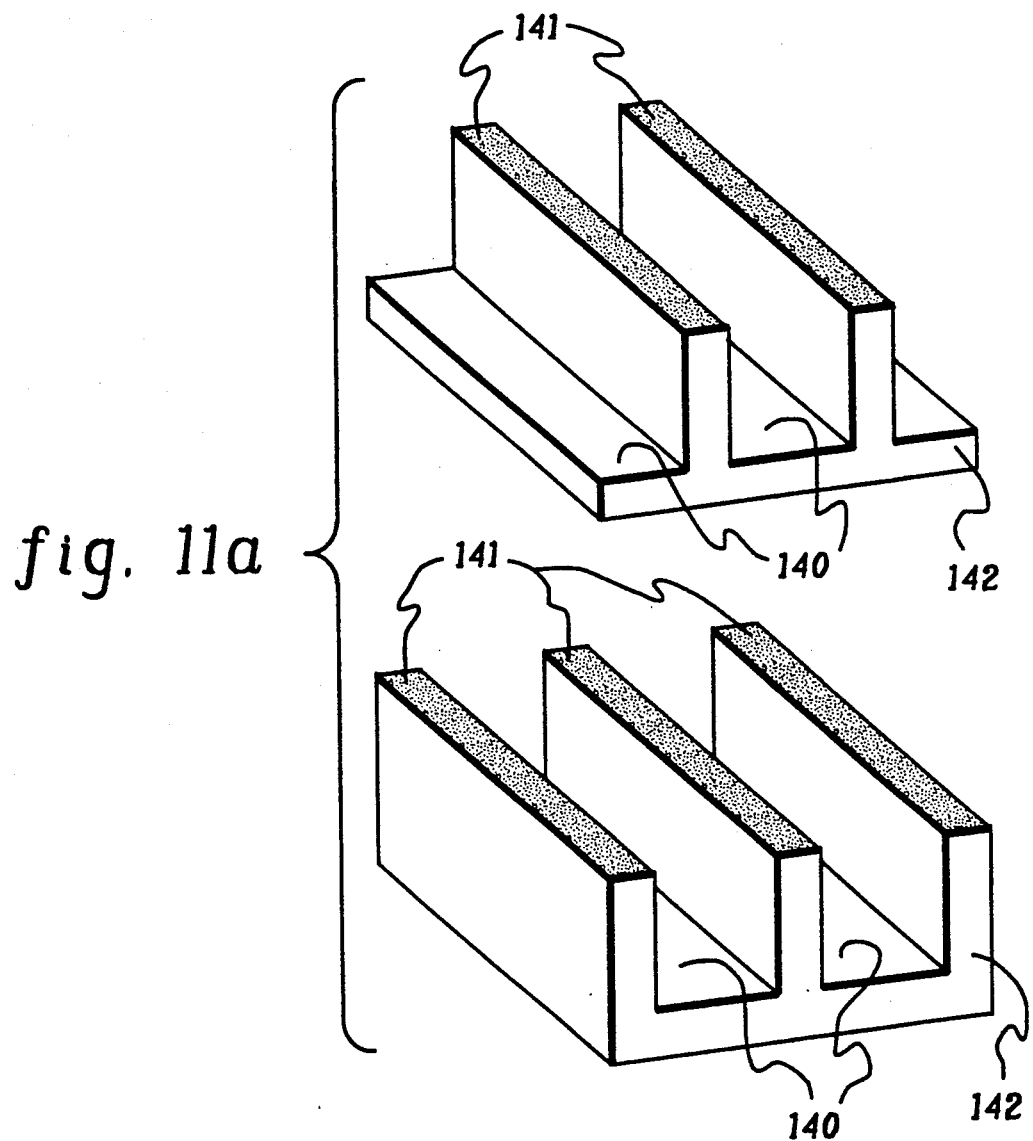
FIG. 11a is a perspective view of one embodiment of two manufactured halves to be assembled into the structure of FIG. 10.
Figure 11B:
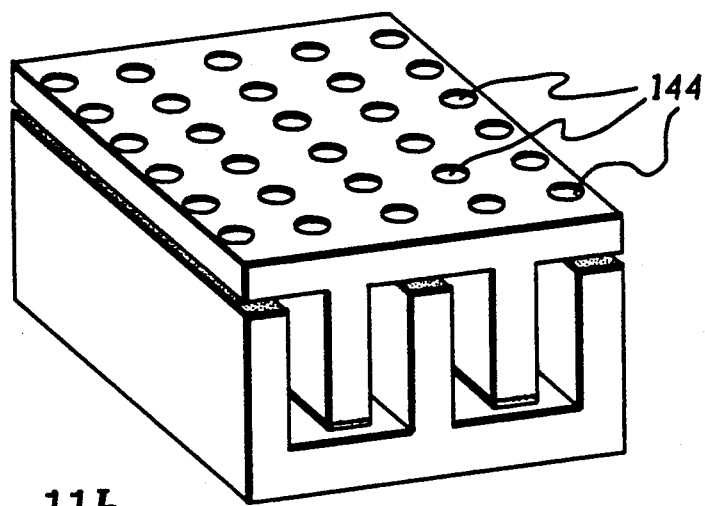
Figure 12:
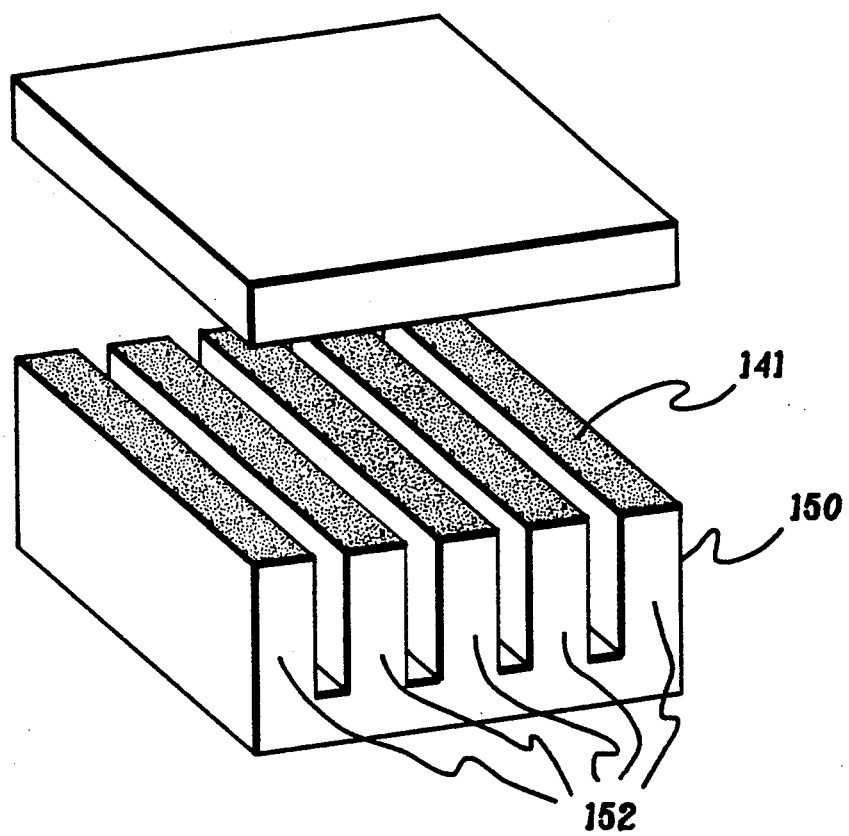
FIG. 12 is a perspective view of another embodiment of two manufactured halves to be assembled into the structure of FIG. 10.

In two presently preferred embodiments, the heat sink is formed as two halves which are then joined together by an adhesive. In both cases, grooves are cut into at least one half of the heat sink material. FIGS. 11a and 11b show a first possible groove pattern for fabrication of the heat sink. This pattern is preferred if heat is to be removed from both sides of the heat sink. Machined grooves 140 are cut into each substrate material 142 so as to be off set when sealed together, via adhesive 141, as shown in FIG. 11b. (FIG. 12 shows a pattern for heat removal from one side only, i.e., the side 150 having the channel defining fins 152.). The technique for cutting the grooves varies with the heat sink material. The preferred nonconducting heat sink material is ceramic, such as alumina or aluminum nitride. The preferred electrically conducting heat sink material is molybdenum. Both of these materials have good thermal coefficient of expansion match to the silicon and GaAs in integrated circuits which are to be attached to the heat sink.

In the case of ceramic, the grooves can be cut using a diamond end mil or, preferably, by using ultrasonic milling. The groove patterns of FIG. 11a are cut such that once assembled every other heat fin is attached to one of the halves of the heat sink (see FIG. 11b). In this way, half of the heat fins are connected directly to one side of the heat sink and half to the other side of the heat sink, thereby giving optimum heat flow to both sides of the heat sink. In the case of the molybdenum heat sink, the grooves can be fabricated by conventional machining techniques or alternatively by electro discharge machining (EDM). After the appropriate grooves have been formed in the two halves of the heat sink an adhesive material 141 is applied to the fins of the heat sink and the assembly is bonded together. The adhesive can be brush or roll coated so that only the top of the fin is covered. An appropriate adhesive which gives good thermal conductivity is thermal epoxy available from Wakefield Engineering of Wakefield, Massachusetts.

Holes 144 are next drilled completely through the fins of the heat sink from the top to the bottom. Holes 144 can be formed using a high powered laser. A laser hole drilling service is available from Laser Services Incorporated. Holes can be formed in ceramic on the order of 5 mils in diameter, with spacings of 20 to 50 mils. Holes of this size can also be formed in metal such as Kovar or Molybdenum. In the case of metal heat sinks, the holes must be insulated before they can be used to provide interconnects through the heat sink.

Figure 13A:
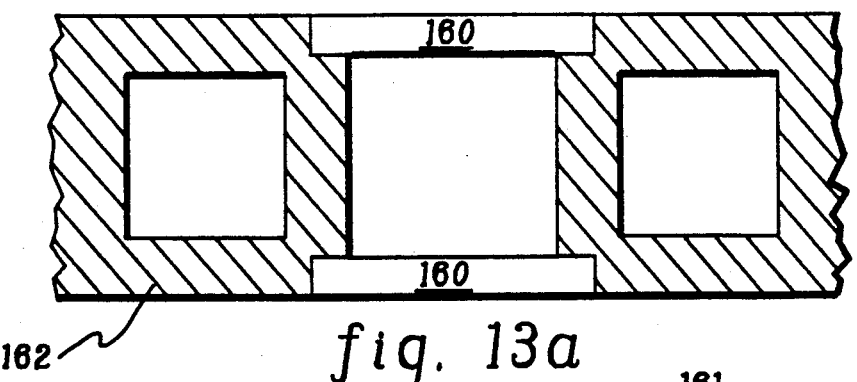
FIGS. 13a–13d are cross-sectional elevational views of one processing embodiment for manufacturing an insulated through hole within a metal substrate pursuant to the present invention.
Figure 13B:
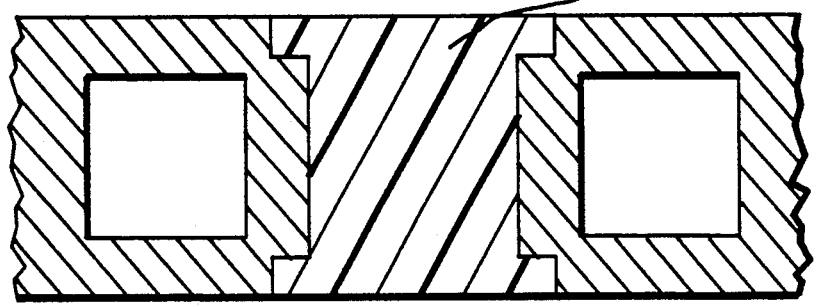

A presently preferred method of insulating holes is to drill holes which are substantially larger that the required through hole diameter (FIG. 13a). In a presently preferred embodiment of this approach, shallow countersink holes 160 are drilled on both sides of the heat sink 162. The holes 160 are subsequently filled with a liquid polymer 161 which is then cured in place leaving a rivet shaped mass of polymer in each hole (see FIG. 13b). A preferred method of filling the holes is to cover one side of the heat sink with a high temperature tape such as M97 polyester tape available from CHR Industries of New Haven, Conn. A bead of polymer material, such as ZOL1004, is placed along one side of the heat sink and a doctor blade is used to squeegee the material across the heat sink and into each hole. The epoxy is then cured by exposure to UV light first on the side away from the tape and second on the side facing the tape. The UV light penetrates the CHR106 tape and cures the polymer in the hole. The tape is then removed and the heat sink is postbaked to improve final properties. Finally, the substrate is lapped to remove residual polymer on the surface of the heat sink and to provide an extremely flat surface on the heat sink for subsequent good thermal interface to the remainder of the system.

Figure 13C:
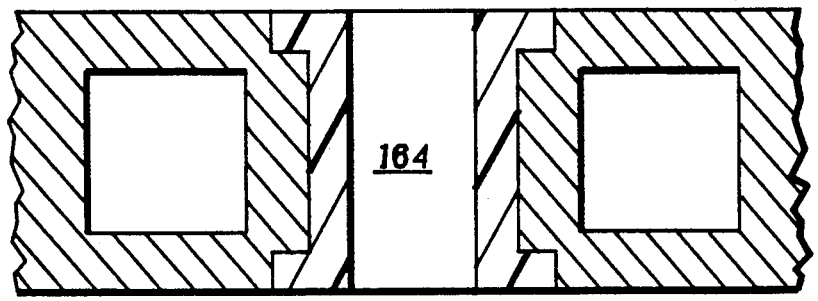

Internal holes are then formed preferably using an Excimer laser with a focused spot to approximately 3 to 5 mils operating at a wave length of 248 nanometers (FIG. 13c). This cleanly ablates the polymer material yielding a hole 164 concentric with the larger hole and insulated from the larger hole by the polymer 161 filling the hole. The small countersink holes assure that the polymer plugs will not fall out of the heat sink. Once the insulation has been provided and the hole redrilled, the metallization process is the same for either the ceramic or the metal heat sink.

The heat sink is placed in a sputtering chamber and titanium and copper is sputtered on one side of the heat sink. The heat sink is then turned over and metal is sputtered on the other. In the case of a metal substrate, if conductor patters are necessary to distribute signals from a regular array of through holes on the heat sink to the area which exists between chips in the module, then an additional layer (not shown) of insulator must be provided over the top and bottom of the heat sink. This layer can be spin coated just after the lapping step and before the Excimer redrilling step.

If apparatus is available to rotate the substrate without removing it from the chamber then the process proceeds by first back sputtering, followed by deposition of 1,000 angstroms on the top side, rotating the substrate so the backside faces the target and depositing 1,000 angstroms of titanium on the back. This is followed by 3,000 angstroms of copper, again rotating the substrate and depositing 3,000 angstroms of copper on the top surface. In most conventional sputtering systems, apparatus to rotate the substrate is not available. As an example, using the Balzer 450 the following metallization is used: a back sputter of two minutes at 1,000 watts followed by titanium at 2,200 watts for eight minutes, which gives 1,000 angstroms, followed by copper deposition at 2,200 watts for a period of ten minutes, which gives 3,000 angstroms. The system is then brought to room pressure and the substrate rotated so the backside faces the targets. Again, the same deposition process is used. At this point, the metal can be built up in a pattern by well known pattern plating techniques.

For example, using Dupont Riston dry film photoresist, laminating this to the substrate, patterning the desired pattern and developing the resist on both sides of the heat sink and electroplating copper to the desired thickness. If gold pads are desired on the heat sink a flash of nickel followed by 50 micro inches of hard gold will serve to provide an oxide free surface for interconnect. The Dupont Riston photoresist is stripped and the seed metallization is etched.

Figure 13D:
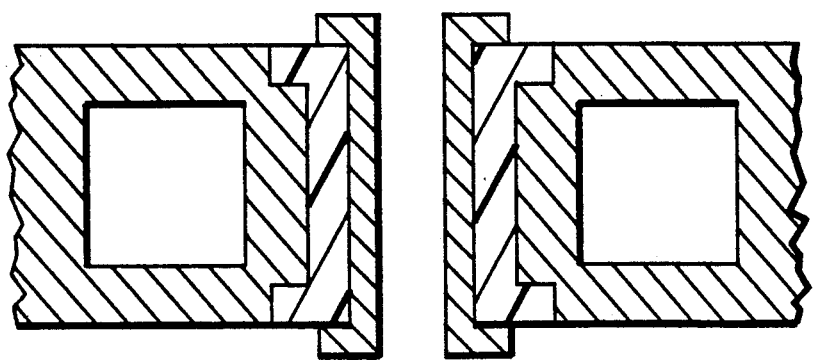

At this point, the heat sink (FIG. 13d) is now ready for incorporation into a number of different various configurations. The exact metal pattern that was formed on the heat sink top and bottom is dictated by the variation. These variations include: 1) A generic liquid cooled heat sink with contact pads in an array on the top and bottom and through electrical connections. 2) The heat sink with integral mass contact means such as button contacts. 3) An integral heat sink with advanced multichip module built on top. 4) The integral heat sink with advanced multichip module on top further having pads on the module top and heat sink bottom to allow stacking.

Figure 14:
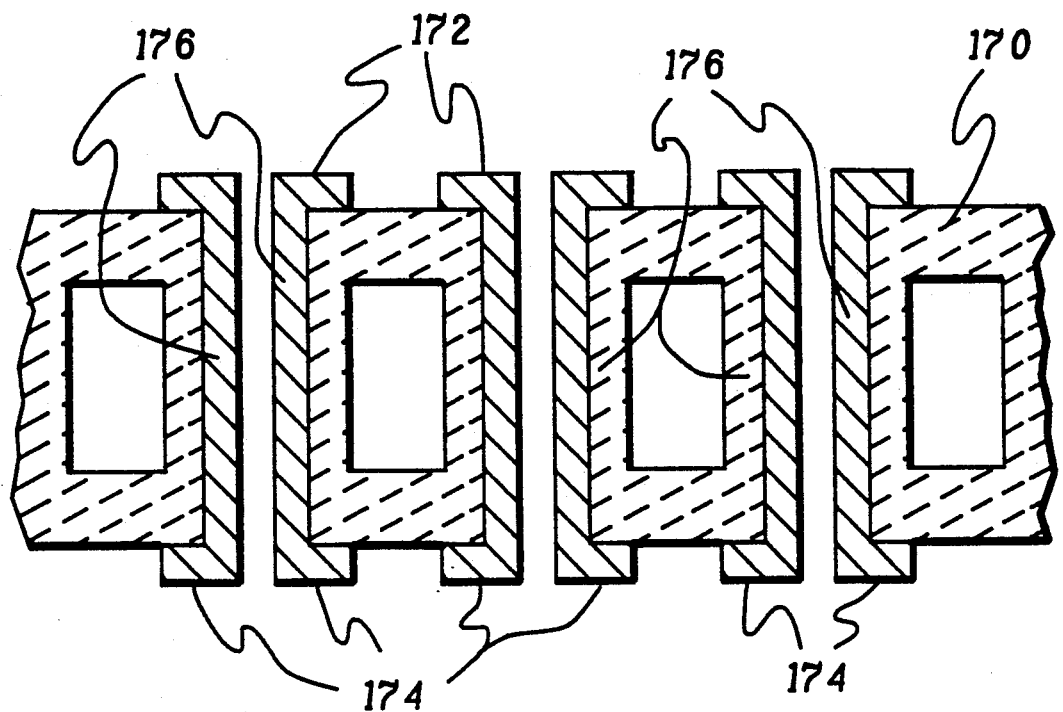
FIG. 14 is a cross-sectional elevational view of another embodiment of the heat sink pursuant to the present invention.
Figure 16:
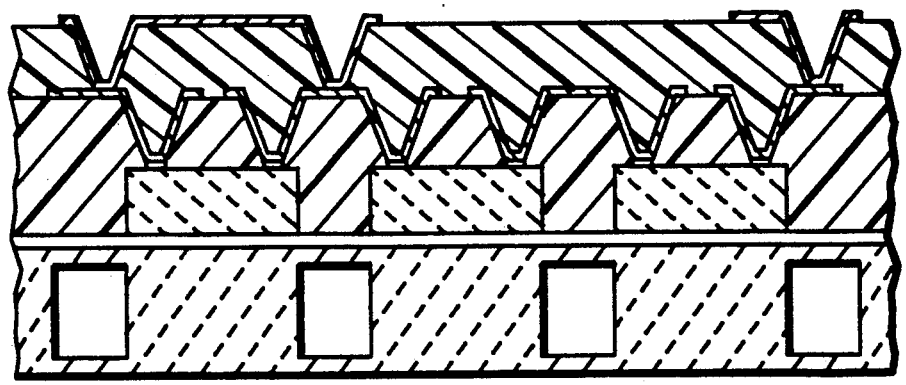
FIG. 16 is a cross-sectional elevational view of one embodiment of a combination multichip module and heat sink structure in accordance with the present invention.

FIG. 14 depicts a cross-section of a liquid cooled heat sink 170 with top contact pads 172 and bottom contact pads 174 and through electrical connections 176. The heat sink is fabricated as described above. When the copper is built up during the pattern plating operation the copper with gold overcoat is patterned plated on the top and bottom surface in the form of round pads. These pads can be used to make electrical contact to modules in the stack.

Figure 15:
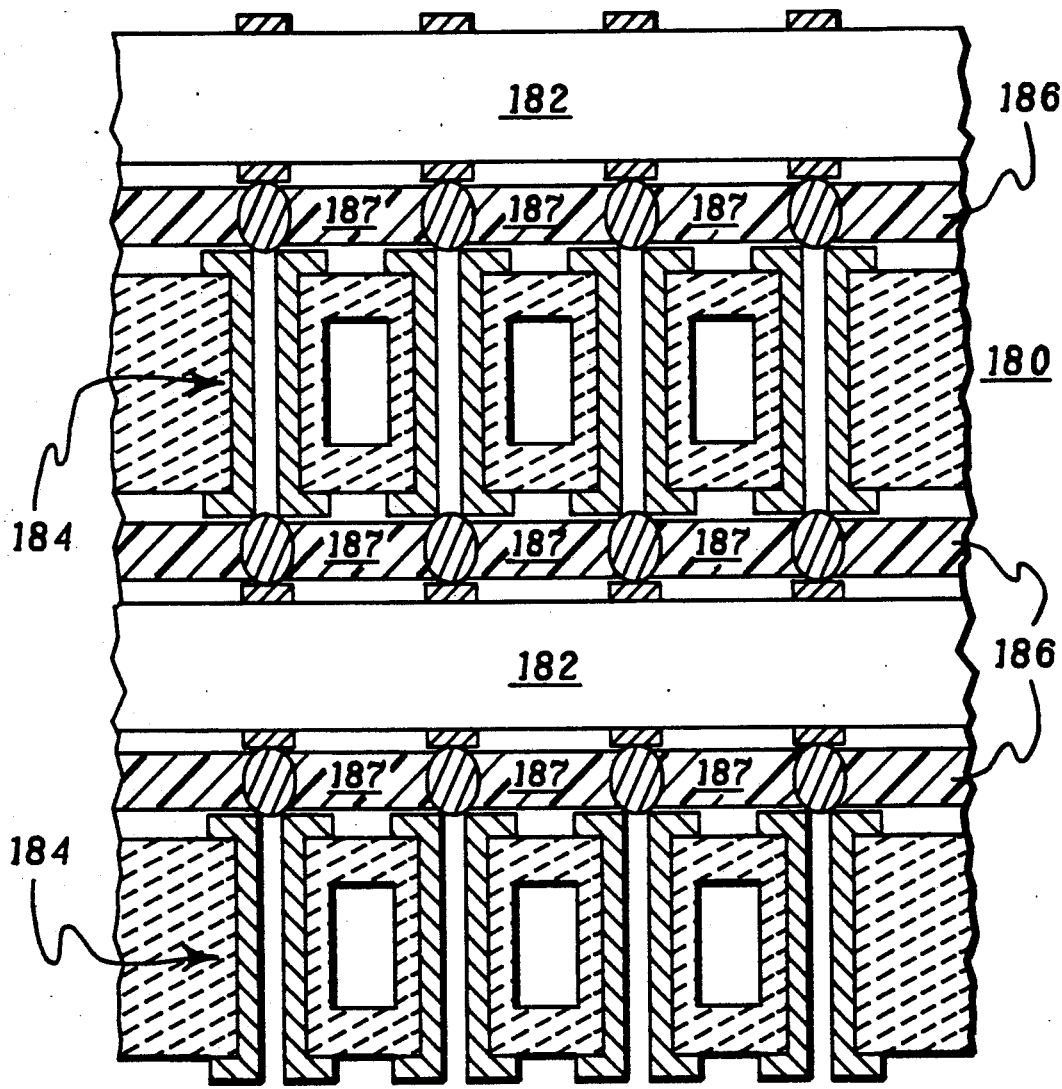
FIG. 15 is a cross-sectional elevational view of one embodiment of a multichip module stack system incorporating a heat sink structure in accordance with the present invention.

One method of providing electrical contact to modules in the stack is through the use of button contacts. This is shown in FIG. 15. Here a stack 180 of advanced multichip modules 182 with top and bottom array pads are interconnected to one another and to through hole heat sinks 184 by the use of button contacts 186. A degree of heat removal can be obtained through the button contacts themselves but the more effective approach to removing heat from the circuitry is to replace the spacer element 187, which is usually plastic, with a high thermal conductivity material. For example, holes can be formed in a 50 mil thick substrate of aluminum nitride material. Twenty mil diameter buttons can be formed and compressed into the aluminum nitride spacer. When an advanced multichip module is connected to a liquid cooled heat sink, the buttons are compressed until the module 182 and the liquid cooled heat sink 184 make direct contact to the button array spacer 186. Since this material is of high thermal conductivity, good thermal interface can be provided between the modules and the liquid cooled heat sinks.

Figure 17:
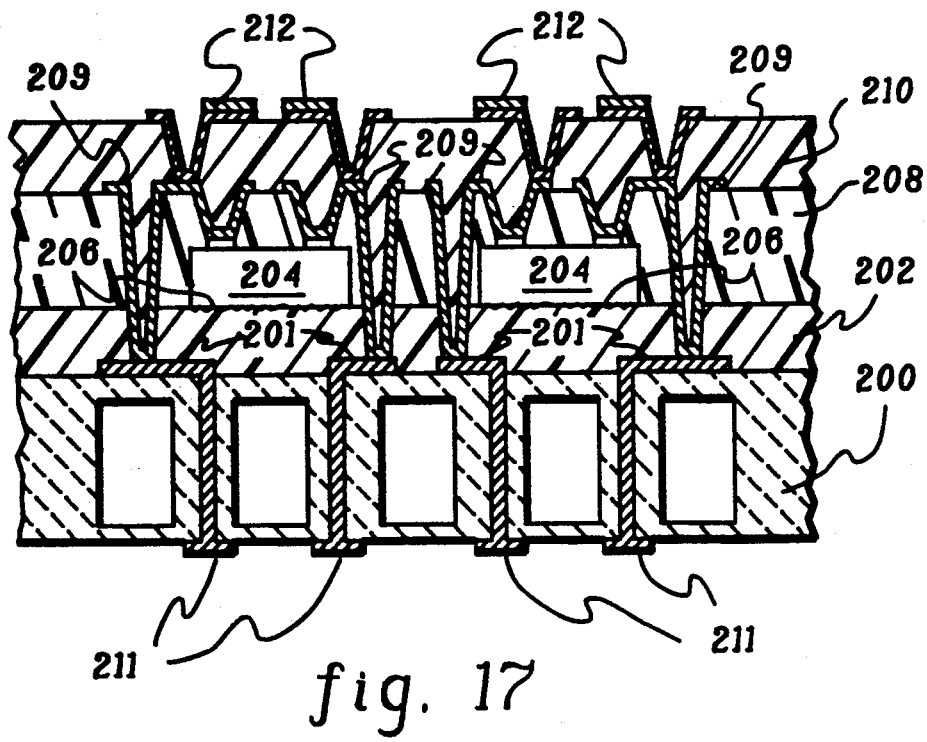
FIG. 17 is a cross-sectional elevational view of another embodiment of a combination multichip module and the heat sink structure in accordance with the present invention.

A structure will be disclosed which comprises an advanced multichip module (pursuant to the cross-referenced application) built using a liquid cooled heat sink as the base substrate. If the through hole liquid cooled heat sink is to be used as the starting base for an advanced multichip module, then as described above with reference to FIGS. 3a and 3b, the resulting conductor pattern on the top surface of the heat sink must distribute the area array of through hole interconnects to locations between adjacent chips. The location of each chip is indicated in FIG. 3b by dotted outline of the chip. The interconnect conductors are patterned during the pattern plating process which is used to build up copper in the through holes and to pattern contact pads on either side of the heat sink 200 (see FIG. 17). (Note that FIG. 3b is also appropriate for a substrate base with thru holes which does not have the liquid cooled heat sink capabilities as described earlier.) As described above, when the pattern plating operation is complete, including plating of a thin layer of nickel followed by gold, the resist is stripped and the deposited seed layer is etched. At this point, a layer of dielectric 202 is deposited on the top of the substrate base 200 to insulate the distribution conductors 201 from the chips 204 which will be subsequently placed on the heat sink. A suitable dielectric layer is ZOL1004. This material can be applied by spin coating at a speed of 3,000 RPM for a period of 20 seconds. The material is first UV cured with a UV energy of 5 joules per square centimeter and subsequently postbaked according to the following schedule: 10 minutes at 150° C. and 30 minutes at 220° C.

Chips 204 can then be placed on the substrate base 200 or, alternatively, provision can be made for a thermal via layer (see FIG. 4). Again, a thermal via layer (not shown) would be provided by forming via holes from the top of the insulating layer to the substrate base. The via holes can be formed as needed in all the spaces between the conductor runs (201) which distribute from array pads to adjacent chip spaces. The via holes are formed using an Excimer laser with focused energy density of 1 to 2 joule per centimeter squared. At the light wave length of 248 nanometers approximately 100 pulses are required to ablate reliably through 1 mil of dielectric insulating material. After via hole formation, the substrate surface is metalized by sputtering 1,000 angstroms of titanium followed by 3,000 angstroms of copper. The copper is then pattern plated to increase its thickness and to provide open areas in the spaces between adjacent chips so that subsequent contact can be made to the distribution conductors.

Figure 18:
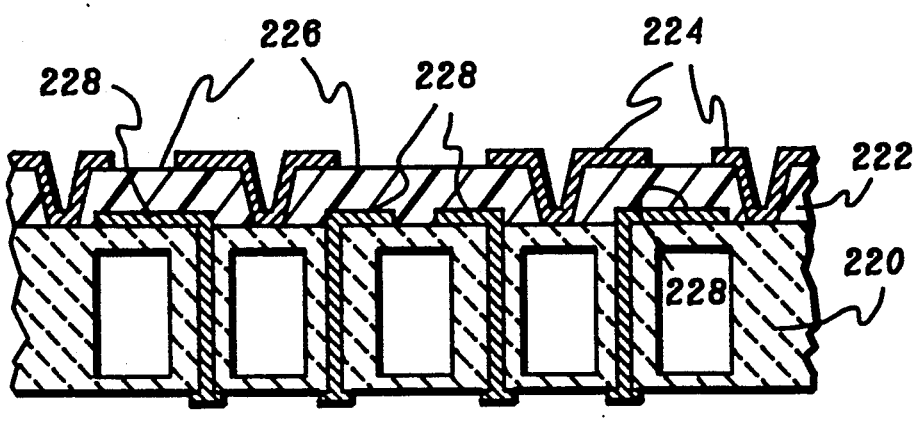
FIG. 18 is a cross-sectional elevational view of one embodiment of a combination heat sink base and thermal vias structure in accordance with the present invention.

FIG. 18 shows a cross-section of a heat sink type substrate base 220 having an insulating layer 222, and thermal vias 224 positioned thereon. Open spaces 226 are provided between vias 224 for subsequent electrical connection to conductors 228. By pattern plating the copper to a thickness of 1 mil the copper can act both as a thermal via and as an effective heat spreader for distributing the heat load from the chips to be attached. By grounding this conductor layer or connecting it to an AC grounded reference voltage this layer forms a strip line with the distribution conductors and can be used to provide shielding from cross talk and constant impedance to these lines.

At this point, the module is ready for fabrication using the methods and structure disclosed in the cross-referenced patent application. According to the process, the chips are thinned to a predetermined thickness and placed using a die attach material 206 (see FIG. 17) which is coated to a well controlled thickness. The chips are placed according to reference feature on the chips themselves. Special methods are used as disclosed to insure that the chips are accurately placed and maintain their accurate positioning throughout the curing cycle of the die attach. Subsequently, the chips are encapsulated in a polymer encapsulant 208 and the surface of the encapsulant is planarized by lapping or other suitable method. Via holes are formed in the encapsulant preferably using an Excimer laser. This step differs from the basic advanced multichip module fabrication methods already disclosed in that via holes are formed both to pads of the chips 204 and to the distribution conductors 201 in the area between the chips.

In a preferred method of fabrication, the via holes to the chip pads are first drilled using an energy density of 1 to 2 joules per square centimeter. The energy to form via holes from the top to the bottom of the encapsulant can be increased substantially because the metallization underneath is thick and capable of diffusing substantial amounts of energy. By increasing the energy to 5 joules per square centimeter the drilling rate can be tripled. Typically 100 pulses are needed to drill through 2 mils of polymer material using 1 to 2 joules per square centimeter. This rate is tripled to 6 mils with 150 pulses using 5 joules per square centimeter. After the holes have been drilled the via holes are metalized 209 by sputtering as described in the cross-referenced application. The metallization is patterned by applying a resist, exposing and developing the resist, and etching the metallization. The method of resist application also differs from the disclosed methods for fabrication of an advanced multichip module. Specifically a method must be provided to protect the deep via hole which spans the thickness of the encapsulant in the area between chips. A method which produces satisfactory results is to double or triple coat the resist using AZP4620. The following described procedure is used. The first coat is applied and spun at a speed of 1,500 RPM. This coat is baked for five minutes at 80° C. A subsequent layer is then spun at a speed 1,500 RPM and baked for five minutes at 80° C. A third coat, if desired, is spun at 1,500 RPM and baked five minutes at 80° C. and ten minutes at 100° C. The final bake at 100° C. would be provided if only two layers of resist are desired. This procedure fills the deep holes with resist without incurring undo thickness of resist on the surface of the module. Patterning of the resist is achieved by exposure to UV light at an energy density of 500 mjoules per square centimeter. The resist is developed in a one part developer, three part water solution of AZP4620 developer available from HOECHT CELANESE. The titanium-copper-titanium sandwich is then etched in the ways previously disclosed and the resist is stripped with acetone. Subsequent layers 210 are added by spin or spray coating a polymer dielectric and repeating the process of via hole formation and metal deposition.

The final interconnect layer to be added to the structure is used to provide a pad array 212 on the top surface of the multichip module. The pads in this pad array are distributed preferably with the same spacing as the pads in the pad array 211 on the bottom of the substrate base. In this way, connection can readily be made from the top of one multichip module to the bottom of the substrate base associated with the next multichip module in a stack, for example, by using button contacts available from Cinch Incorporated. The processing steps necessary to provide the pad array structure are described below.

After the appropriate interconnect layers have been provided, a layer of dielectric is applied to the module by spin or spray techniques. ZTI1004 can be used at a spin speed of 1,500 RPM for a period of twenty seconds. This material is then cured under UV light with an energy of 2 joules per square centimeter. The material is postbaked at 150° C. for five minutes and 220° C. for a period of twenty minutes. Following postbake, via holes are formed to the interconnect layer beneath using an Excimer laser as described earlier. Metallization is applied as described earlier in which titanium is sputtered to a thickness of 1,000 angstroms and copper is sputtered to a thickness of 3,000 angstroms. At this point, the module is removed from the sputtering chamber and coated with a thick coating of photo patternable resist. A negative acting resist type F360 can be used. This material is available from Chem Line Incorporated. The resist is spun at a speed of 1,500 RPM for a period of twenty seconds. The resist is baked for twelve minutes at 100° C. The resist is patterned using an exposure energy of 100 mjoule per square centimeter and a development time of 100 seconds in a 1% sodium carbonate solution. This leaves the area where the pads are desired exposed. Electrical connection is then made to the metal of the substrate and electroplating of copper proceeds. An electroplating current of 35 amperes per square centimeter for a time period of forty minutes is used to achieve a total thickness of electroplated copper greater than twelve microns. After copper plating the assembly is plated in a nickel bath to build up the thickness of nickel to approximately 100 micro inches and to provide a barrier between the nickel and the gold which will subsequently be plated. After nickel plating, the substrate is rinsed and placed directly in an acid gold plating bath such as that available from Transene Incorporated. Gold is plated to a thickness of at least fifty micro inches. After gold plating, the resist is removed by dipping the substrate in a 5% ammonium hydroxide solution for a period of one minute. The substrate is rinsed and placed in a copper etch consisting of one part ferric chloride and ten parts deionized water. This etch takes place for a period of thirty seconds to remove the background copper and leave only titanium exposed. The titanium is etched in a one to twelve solution of TFT etch available from Transene Corporation. At this point, an environmental coating is added which coats the entire top surface of the module except for openings provided above each I/O pad.

It should be noted that the structure of FIG. 1 can be used in a stack configuration where one module is connected to the next using an interconnect means such as button contacts. Such a configuration is believed to be particularly unique. Further, the module stack can be disassembled for repair or incorporation of additional or different modules. Disassembly can easily be achieved in field use. In addition, the advanced multichip module and the heat sink are integrally related with essentially the same process steps required to fabricate the advanced multichip whether the substrate base is a heat sink or any other flat substrate. The direct thermal interface of the chips to the liquid cooled heat sink gives the best possible cooling efficiency and allows very high performance systems to be achieved. The ability to provide heat sinks that have shielding on the pins, either in the form of a metal heat sink with the coaxial through hole or by coating insulating fins with metal, gives shielding from cross talk and impedance control so that reflections are minimized and very high speed interconnect (speeds above 1 GHz.) can be achieved. It should also be noted that single units of an advanced multichip module capability can be provided with an integral heat sink. In this particular configuration, it may not be necessary to provide through holes to the heat sink since the module will not be required to be stacked. The advantage of this configuration is the improved thermal performance which is achieved by directly mounting the chips for the module on the heat sink.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multichip integrated circuit package having an upper surface and a lower surface, said package comprising:
    a substrate;
    a plurality of integrated circuit chips disposed on an upper surface of said substrate, said integrated circuit chips each having at least one interconnection pad on a top surface thereof;
    encapsulant surrounding said integrated circuit chips, said encapsulant surrounding said integrated circuit chips, the integrated circuit chips and having a plurality of via openings therein, said openings being aligned with at least some of said interconnection pads;
    a pattern of interconnection conductors disposed above the upper surface of said encapsulant so as to extend between at least some of the openings therein and so as to provide electrical connection to at least some of the interconnection pads through the said openings; and
    conductive means disposed within said substrate and said encapsulant so as to provide electrical connection between the lower surface of said substrate and the interconnection conductors disposed above the upper surface of said encapsulant, said conductive means being disposed within said encapsulant so as to pass between said plurality of integrated circuit chips.

2. The integrated circuit package of claim 1, further comprising an array of conductor pads disposed on the lower surface of said integrated circuit package.

3. The integrated circuit package of claim 2, further comprising:
    an array of conductor pads disposed on the upper surface of said integrated circuit package; and
    said conductive means being disposed within said substrate and said encapsulant so as to provide electrical connection between at least some of said lower surface array of conductor pads and at least one of the pads of the upper surface array of conductor pads and the interconnection conductors disposed above the upper surface of said encapsulant, said conductive means also providing electrical connection between at least some of said upper surface array of conductor pads and at least one of the pads of the lower surface array of conductor pads and the interconnection conductors disposed above the upper surface of said encapsulant.

4. The integrated circuit package of claim 3, wherein the upper surface and lower surface of said substrate are in substantially parallel planes, and wherein said package further comprises at least one cooling channel disposed within said substrate.

5. The integrated circuit package of claim 4, wherein said package further includes a plurality of cooling channels disposed within said substrate, each of said channels being oriented substantially parallel to the planes of said upper and lower surfaces.

6. The integrated circuit package of claim 3, wherein said upper surface array of conductor pads is disposed over substantially the entire upper surface of said integrated circuit package, and wherein said lower surface array of conductor pads is disposed over substantially the entire lower surface of said integrated circuit package.

7. The integrated circuit package of claim 3, wherein said upper surface array of conductor pads and said lower surface array of conductor pads each has an equal number of conductor pads therein, and wherein each conductor pad of said upper surface array of conductor pads is aligned with a respective conductor pad of said lower surface array of conductor pads.

8. The integrated circuit package of claim 3, wherein said upper surface of said package comprises the upper surface of said encapsulant, and wherein the lower surface of said package comprises the lower surface of said substrate.

9. The integrated circuit package of claim 3, wherein said conductive means electrically connects each of said pads in said lower surface array of conductor pads to at least one of a pad in said upper surface array of conductor pads and a conductor of the interconnection conductors disposed on the upper surface of said encapsulant, and wherein said conductive means electrically connects each of said pads in said upper surface array of conductor pads to at least one of a pad in the lower surface array of conductor pads and a conductor of the interconnection conductors disposed on the upper surface of said encapsulant.

10. The integrated circuit package of claim 1 wherein the conductive means includes metalized via holes in said encapsulant extending substantially to the upper surface of said substrate in the area of said encapsulant between said plurality of integrated circuit chips.

11. The integrated circuit package of claim 10, wherein said conductive means includes metalized through holes disbursed throughout said substrate, each of said through holes extending from the upper surface of said substrate to the lower surface of said substrate, and each metalized through hole having a conductor pad electrically coupled thereto at the lower surface of said substrate, said conductor pads comprising an array of conductor pads on the lower surface of said package.

12. The integrated circuit package of claim 11, wherein said conductive means includes a plurality of distribution conductors, said plurality of distribution conductors being disposed on the upper surface of said substrate and positioned to electrically connect at least some of said metalized via openings positioned between said integrated circuit chips and said metalized through holes in said substrate.

13. The integrated circuit package of claim 12, wherein said conductive means includes means for electrically coupling selected conductor pads of said array of conductor pads on the upper surface of said package with at least some of said metallized via openings disposed in said encapsulant between said integrated circuit chips.

14. The integrated circuit package of claim 13, further comprising at least one cooling channel disposed within said substrate.

15. The integrated circuit package of claim 3, wherein each pad of a plurality of conductor pads of said lower surface array of conductor pads is electrically coupled via said conductive means to a respective one of said pads in said array of conductor pads on the upper surface of said package.

16. The integrated circuit package of claim 1, wherein said conductive means includes metallization disposed within columns provided within said package extending from the upper surface of said package to the lower surface of said package, said columns being disposed within said package so as to avoid passing through one of said plurality of integrated circuit chips.

17. The integrated circuit package of claim 16, wherein the substrate comprises a thin metal.

18. The integrated circuit package of claim 17, wherein said metalized columns pass through said metal substrate and are isolated therefrom by said encapsulant.

19. The integrated circuit package of claim 16, wherein said substrate has a plurality of cooling channels disposed therein, each of said channels being oriented substantially parallel to the upper and lower substrate surfaces.

20. The integrated circuit package of claim 1, further including:
  a dielectric layer overlying said encapsulant and a portion of said interconnection conductors, said dielectric layer also including a plurality of via openings therein aligned with at least some of said interconnection conductors underlying said dielectric layer; and
  said pattern of interconnection conductors being partially disposed above said dielectric layer and extending between at least some of the openings in said dielectric layer so as to provide electrical connection with interconnection conductors underling said dielectric layer.

21. The integrated circuit package of claim 1, wherein the substrate comprises material selected from the group consisting of glass, ceramic, plastic, silicon and composites.

22. The integrated circuit package of claim 1, wherein the substrate comprises material selected from the group consisting of alumina and aluminum nitride.

23. The integrated circuit package of claim 1, wherein said encapsulant is a polymer material selected from the group consisting of thermoplastic and thermoset materials.

24. A multichip module stack system comprising:
  a first multichip integrated circuit package and a second multichip integrated circuit package, each of said packages having an array of conductor pads on at least one of an upper surface and a lower surface thereof, each of said array of conductor pads being electrically connected to at least some of the integrated circuit chips disposed within said respective package, each of said packages including:
  (i) a substrate,
  (ii) a plurality of integrated circuit chips disposed on an upper surface of said substrate, said integrated circuit chips each having at least one interconnection pad on a top surface thereof,
  (iii) an encapsulant surrounding said integrated circuit chips, said encapsulant having an upper surface above the tops of the integrated circuit chips and having a plurality of via openings therein, said openings being aligned with at least some of the interconnection pads, (iv) a pattern of interconnection conductors disposed above the upper surface of said encapsulant so as to extend between at least some of the openings therein and so as to provide electrical connection between at least some of the interconnection pads through said via openings;

means for electrically coupling at least some of said conductor pads in said arrays of conductor pads on said first and second multichip packages; and said packages being in a stacked configuration with said electrical coupling means located therebetween.

25. The multichip module stack system of claim 24, wherein each of said packages includes an array of conductor pads on a upper surface thereof and an array of conductor pads on a lower surface thereof.

26. The multichip modules stack system of claim 25, wherein said package electrical coupling means includes an array of button contacts, said button contact array being disposed between at least some of said arrays of contact pads of said stacked packages.

27. The multichip module stack system of claim 25, further comprising a plurality of multichip packages, each package being stacked within said stack system, and each being electrically coupled to an adjacent one of said packages of electrical connecting means disposed therebetween.

28. The multichip module stack system of claim 27, wherein each of said electrical connecting means includes an array of button contacts disposed between adjacent packages to engage at least some of said respective arrays of contact pads on the upper surface and the lower surface of said adjacent packages.

29. The multichip module stack system of claim 27, wherein each of said multichip packages disposed within said stack includes a physically engagable tab on an outer edge thereof.

30. The multichip module stack system of claim 29, further comprising at least one heat sink structure disposed within said stack.

31. The multichip module stack system of claim 30, wherein said heat sink structure includes:

a substrate having an upper surface and a lower surface, said upper and lower surfaces being in substantially parallel planes;

at least one liquid carrying cooling channel disposed within said substrate, said cooling channel extending substantially parallel to the planes of said upper and lower substrate surfaces; and a plurality of vertically oriented metalized columns in said substrate, said columns being positioned so as not to intersect said at least one cooling channel and being oriented so as to substantially perpendicularly intersect the planes of said upper and lower surfaces.

32. The multichip module stack system of claim 3, wherein said heat sink structure includes an array of conductor pads on the upper surface thereof and an array of conductor pads on the lower surface thereof, each of said conductor pads being coupled to one of said vertically oriented metalized columns.

33. The multichip module stack system of claim 32, wherein said conductor pads in said upper and lower surface arrays of conductor pads are each positioned to align with a conductor pad of an adjacent one of said plurality of packages within said stack system.

34. A multichip integrated circuit package comprising:

a substrate having an upper and lower surface and at least one liquid receiving cooling channel therein, said cooling channel being disposed so as not to intersect said upper and lower substrate surfaces;

a plurality of integrated circuit chips disposed on said substrate's upper surface, said integrated circuit chips each having at least one interconnection pad on a top surface thereof;

an encapsulant surrounding said integrated circuit chips, said encapsulant having an upper surface above the tops of the integrated circuit chips and having a plurality of via openings therein, said via openings being aligned with at least some of said interconnection pads; and a pattern of interconnection conductors disposed above the upper surface of said encapsulant so as to extend between at least some of said openings and so as to provide electrical connection to at least some of said interconnection pads through said openings.

35. The integrated circuit package of claim 34, wherein said substrate includes a plurality of liquid cooling channels therein.

36. The integrated circuit package of claim 35, wherein each of said plurality of liquid cooling channels is disposed substantially parallel to said upper and lower surfaces of said substrate.

37. The integrated circuit package of claim 36, wherein the substrate comprises materials selected from the group consisting of glass, metal, ceramic, plastic, silicon and composites.

38. The integrated circuit package of claim 35, further comprising a patterned layer of thermal conductors disposed between said plurality of integrated circuit chips and said substrate's upper surface, said thermal conductors being patterned to conduct heat from said integrated circuit chips to said substrate.

39. A heat sink structure for assembly with at least one multichip integrated circuit package, said structure comprising:

a substrate having an upper surface and a lower surface, said upper and lower surfaces being in substantially parallel planes;

at least one cooling channel disposed within said substrate, said at least one said cooling channel extending substantially parallel to the planes of said upper and lower substrate surfaces; and at least one metalized column in said substrate, said metalized column being positioned so as not to intersect said at least one channel and being oriented as so to perpendicularly intersect the planes of said upper an lower surfaces.

40. The heat sink structure of claim 39, wherein a plurality of cooling channels is provided within said substrate, each of said channels being oriented substantially parallel to the planes of said upper and lower substrate surfaces.

41. The heat sink structure of claim 40, wherein a plurality of metalized columns is provided within said substrate.

42. The heat sink structure of claim 4, wherein each of said plurality of metallized columns has a layer of metallization disposed therein extending from said upper substrate surface to said lower substrate surface, said column of metallization facilitating electrical connection through said heat sink structure.

43. The heat sink structure of claim 42, wherein said substrate comprises material selected from the group consisting of glass, metal, ceramic, plastic, silicon and composites.

44. The heat sink structure of claim 42, wherein at least one of said upper and lower substrate surfaces includes an array of conductor pads disposed thereon, each conductor pad in said array being electrically coupled to one of said metalized column extending through said substrate.

45. A multichip module stack system comprising:
a first multichip integrated circuit package and a second multichip integrated circuit package, each of said packages having a plurality of columns therein extending between an upper surface and a lower surface thereof, and each including metallization disposed therein, at least some of said metalized columns being electrically connected to at least some of the integrated circuit chips disposed within said respective package, each of said packages including:
(i) a substrate,
(ii) a plurality of integrated circuit chips disposed on an upper surface of said substrate, said integrated circuit chips each having at least one interconnection pad on a top surface thereof,
(iii) an encapsulant surrounding said integrated circuit chips, said encapsulant having an upper surface above the tops of the integrated circuit chips and having a plurality of via openings therein, said via openings being aligned with at least some of the interconnection pads,
(iv) a pattern of interconnection conductors disposed above the upper surface of said encapsulant so as to extend between at least some of the openings therein and so as to provide electrical connection between at least some of the interconnection pads through said via openings;
means for electrically coupling at least some of said plurality of metalized columns of said first multichip package to at least some of said plurality of metalized columns of said second multichip package; and
said packages being disposed in a stacked configuration.

46. The multichip module stack system of claim 45, wherein said electrical coupling means includes a layer of metallization disposed so as to provide electrical connection between at least some of said metalized columns of said first multichip package with at least some of said metalized columns of said second multichip package.

47. The multichip module stack system of claim 45, wherein at least some of the substrates of said plurality of packages are sufficiently fine so as to be non-rigid, and said stack system further includes a rigid base plate upon which said plurality of packages are stacked.

48. The multichip module stack system of claim 45, wherein at least some of said plurality of metalized columns of said first multichip package align with at least some of said plurality of metalized columns o said second multichip package when said packages are disposed in said stacked configuration.

49. The multichip module stack system of claim 48, wherein said electrical coupling means of said stack includes a metallization layer disposed throughout the aligned columns of said stacked packages.

* * * * *

UNITED STATES PATENT AND TRADEMARK OFFICE
CERTIFICATE OF CORRECTION

PATENT NO. : 5,111,278
DATED : May 5, 1992
INVENTOR(S) : Eichelberger

It is certified that error appears in the above-identified patent and that said Letters Patent is hereby corrected as shown below:

Column 29, line 58, substitute --claim 31-- for "claim 3"

Column 30, line 54, substitute --and-- for "an"

Column 31, line 9, substitute --columns-- for "column"

Column 32, line 27, substitute --of-- for "o"

Signed and Sealed this

Twenty-first Day of June, 1994

Attest:

BRUCE LEHMAN

Attesting Officer   Commissioner of Patents and Trademarks